United States Patent
Kawakami et al.

(10) Patent No.: US 11,175,360 B2
(45) Date of Patent: Nov. 16, 2021

(54) MAGNETIC RESONANCE IMAGING APPARATUS

(71) Applicant: CANON MEDICAL SYSTEMS CORPORATION, Otawara (JP)

(72) Inventors: Taketo Kawakami, Saitama (JP); Yoshitomo Sakakura, Nasushiobara (JP); Hidekazu Tanaka, Nasushiobara (JP); Takahiro Ishihara, Otawara (JP)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 20 days.

(21) Appl. No.: 16/108,889

(22) Filed: Aug. 22, 2018

(65) Prior Publication Data

US 2019/0064291 A1 Feb. 28, 2019

(30) Foreign Application Priority Data

Aug. 28, 2017 (JP) .............................. JP2017-163720

(51) Int. Cl.
*G01R 33/385* (2006.01)
*G01R 33/54* (2006.01)

(52) U.S. Cl.
CPC ....... *G01R 33/3856* (2013.01); *G01R 33/546* (2013.01)

(58) Field of Classification Search
CPC .......................... G01R 33/3856; G01R 33/546
See application file for complete search history.

(56) References Cited

U.S. PATENT DOCUMENTS

| | | | | |
|---|---|---|---|---|
| 2002/0148604 | A1* | 10/2002 | Emeric | G01R 33/28 165/206 |
| 2010/0271028 | A1 | 10/2010 | Kawamoto | |
| 2015/0338482 | A1* | 11/2015 | Sakakura | G01R 33/3856 324/319 |
| 2016/0109542 | A1* | 4/2016 | Sakakura | G01R 33/385 324/322 |

FOREIGN PATENT DOCUMENTS

| | | |
|---|---|---|
| JP | 2008-012118 | 1/2008 |
| JP | 2010-269136 | 12/2010 |
| JP | 2011-010760 | 1/2011 |

* cited by examiner

*Primary Examiner* — Patrick Assouad
*Assistant Examiner* — Haidong Zhang
(74) *Attorney, Agent, or Firm* — Oblon, McClelland, Maier & Neustadt, L.L.P.

(57) ABSTRACT

A magnetic resonance imaging apparatus according to an embodiment is a magnetic resonance imaging apparatus including a gradient coil unit configured to generate a gradient magnetic field in an imaging space in which a subject is placed. The gradient coil unit includes a cooling layer configured to cool the gradient coil. The cooling layer includes a first cooling pipe configured to cool the gradient coil entirely and a second cooling pipe configured to locally cool the gradient coil.

18 Claims, 8 Drawing Sheets

MAGNETIC RESONANCE IMAGING APPARATUS

CROSS-REFERENCE TO RELATED APPLICATIONS

This application is based upon and claims the benefit of priority from Japanese Patent Application No. 2017-163720, filed on Aug. 28, 2017; the entire contents of which are incorporated herein by reference.

FIELD

Embodiments described herein relate generally to a magnetic resonance imaging apparatus.

BACKGROUND

Conventionally, gradient coils used in Magnetic Resonance Imaging (MRI) apparatuses generate heat, due to an electric current applied thereto for the purpose of generating a gradient magnetic field and an eddy current occurring from the gradient magnetic field. Generally, to remove such heat, gradient coils are provided with a cooling pipe through which refrigerant is arranged to flow.

DETAILED DESCRIPTION

A magnetic resonance imaging apparatus according to an embodiment is a magnetic resonance imaging apparatus including a gradient coil unit configured to generate a gradient magnetic field in an imaging space in which a subject is placed. The gradient coil unit includes a cooling layer configured to cool the gradient coil. The cooling layer includes a first cooling pipe configured to cool the gradient coil entirely and a second cooling pipe configured to locally cool the gradient coil.

Exemplary embodiments of a magnetic resonance imaging apparatus will be explained in detail below, with reference to the accompanying drawings.

First Embodiment

Figure 1:
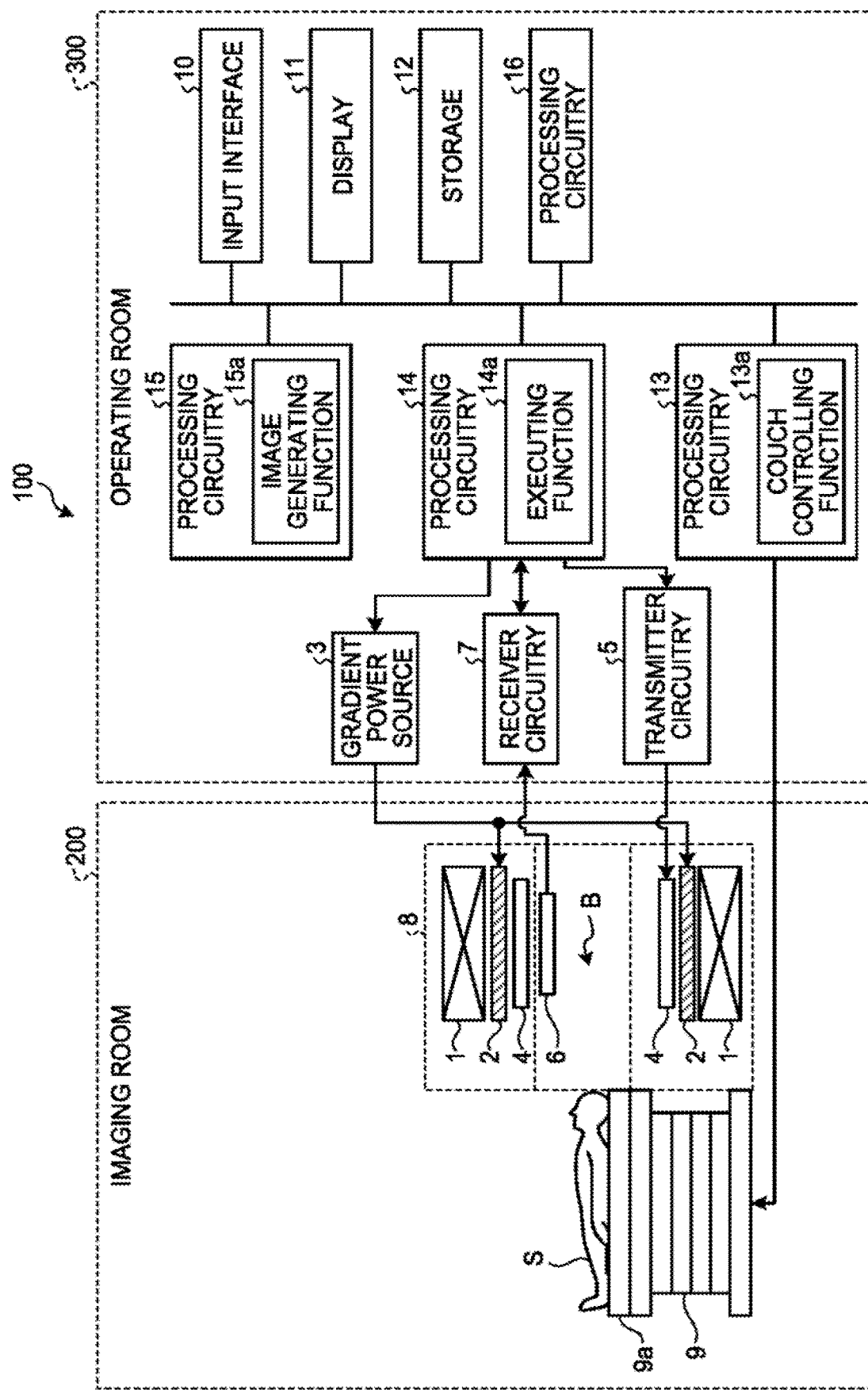
FIG. 1 is a diagram illustrating an exemplary configuration of a magnetic resonance imaging apparatus according to a first embodiment.

FIG. 1 is a diagram illustrating an exemplary configuration of a Magnetic Resonance Imaging (MRI) apparatus 100 according to a first embodiment. For example, as illustrated in FIG. 1, the MRI apparatus 100 according to the first embodiment includes: a static magnetic field magnet 1, a gradient coil 2, a gradient power source 3, a transmitter coil 4, transmitter circuitry 5, a receiver coil 6, receiver circuitry 7, a gantry 8, a couch 9, an input interface 10, a display 11, a storage 12, and processing circuitries 13 to 16.

The static magnetic field magnet 1 is configured to generate a static magnetic field in an imaging space in which a subject S is placed. More specifically, the static magnetic field magnet 1 is formed to have a hollow and substantially circular cylindrical shape (which may have an oval cross-section orthogonal to the central axis thereof) and is configured to generate the static magnetic field in the space on the inside of the circular cylinder. For example, the static magnetic field magnet 1 includes a cooling container formed to have a substantially circular cylindrical shape and a magnet such as a superconductive magnet that is immersed in a cooling member (e.g., liquid helium) filling the cooling container. In this situation, for example, the static magnetic field magnet 1 may be configured to generate the static magnetic field by using a permanent magnet.

The gradient coil 2 is disposed on the inside of the static magnetic field magnet 1 and is configured to generate a gradient magnetic field in the imaging space in which the subject S is placed. More specifically, the gradient coil is formed to have a hollow and substantially circular cylindrical shape (which may have an oval cross-section orthogonal to the central axis thereof) and is configured to generate gradient magnetic fields along X-, Y-, and Z-axes that are orthogonal to one another in the space on the inside of the circular cylinder. In this situation, the X-axis, the Y-axis, and the Z-axis structure an apparatus coordinate system unique to the MRI apparatus 100. For example, the Z-axis is set so as to coincide with the axis of the circular cylinder of the gradient coil 2 and to extend along a magnetic flux in the static magnetic field generated by the static magnetic field magnet 1. Further, the X-axis is set to extend along the horizontal direction orthogonal to the Z-axis. The Y-axis is set to extend along the vertical direction orthogonal to the Z-axis.

More specifically, the gradient coil 2 is formed by laminating together three coils (i.e., an X-coil, a Y-coil, and a Z-coil) corresponding to the X-axis, the Y-axis, and the Z-axis, respectively. The X-coil is a saddle coil formed to have a saddle-like shape and is configured to generate the gradient magnetic field along the X-axis, i.e., the horizontal direction orthogonal to the axis of the circular cylinder of the gradient coil 2. Further, the Y-coil is also a saddle coil similarly to the X-coil and is configured to generate the gradient magnetic field along the Y-axis, i.e., the up-and-down direction orthogonal to the axis of the circular cylinder of the gradient coil 2. Further, the Z-coil is a solenoid coil formed to have a helical shape and is configured to generate the gradient magnetic field along the Z-axis, i.e., the axis of the circular cylinder of the gradient coil 2.

Figure 2:
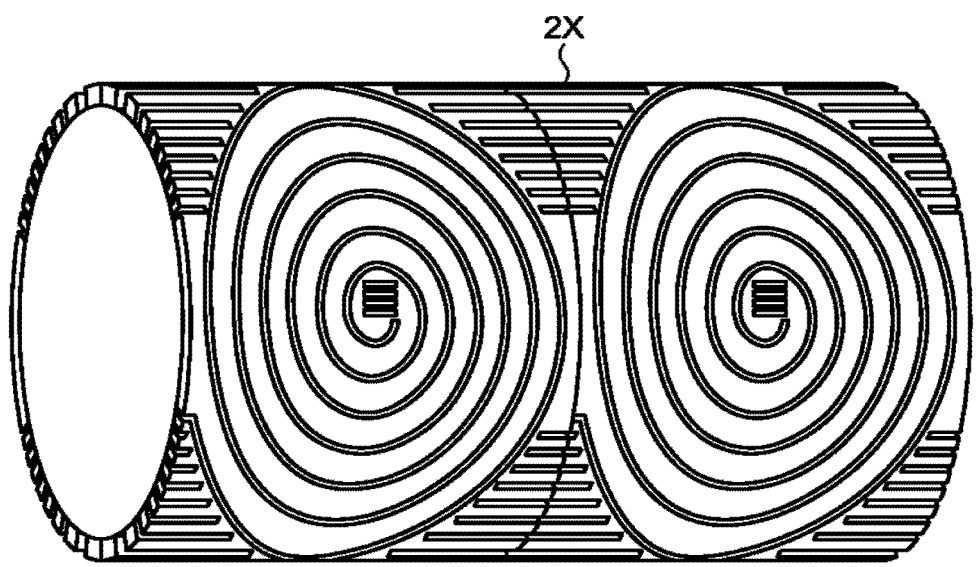
FIG. 2 is a drawing illustrating an example of an X-coil included in a gradient coil according to the first embodiment.
Figure 3:
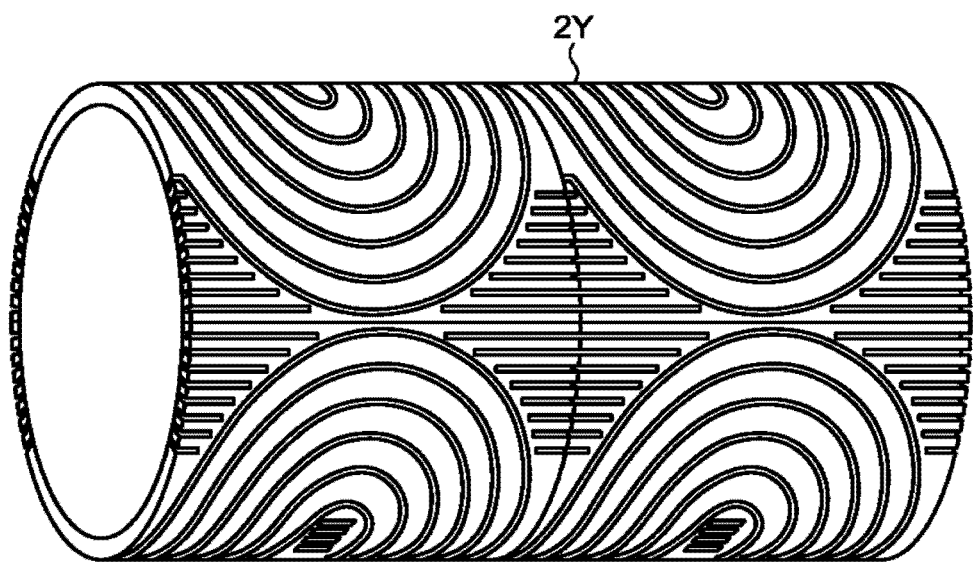
FIG. 3 is a drawing illustrating an example of a Y-coil included in the gradient coil according to the first embodiment.

FIG. 2 is a drawing illustrating an example of the X-coil included in the gradient coil 2 according to the first embodiment. FIG. 3 is a drawing illustrating an example of the Y-coil included in the gradient coil 2 according to the first embodiment.

For example, as illustrated in FIG. 2, an X-coil 2X includes two coil loops arranged on one side in terms of the horizontal direction (i.e., the side closer to viewers of FIG. 2) and two coil loops (not illustrated) arranged on the other side (i.e., the side farther from viewers of FIG. 2), while the axis of the circular cylinder be gradient coil 2 is interposed between the two sides. In this situation, the coil loops arranged on the one side in terms of the horizontal direction are positioned in such a manner that the centers thereof oppose, in the horizontal direction, the centers of the coil loops arranged on the other side, while the axis of the circular cylinder of the gradient coil 2 is interposed therebetween. Further, while an electric current is flowing, the X-coil 2X is configured to generate the gradient magnetic field along the horizontal direction orthogonal to the axis of the circular cylinder of the gradient coil 2, by generating magnetic fluxes each penetrating the coil loops opposing each other.

In contrast, for example, as illustrated in FIG. 3, a Y-coil 2Y includes two coil loops arranged on one side in terms of the vertical direction (i.e., the top side of FIG. 3) and two coil loops arranged on the other side (i.e., the bottom side of FIG. 3), while the axis of the circular cylinder of the gradient coil 2 is interposed between the two sides. In this situation, the coil loops arranged on the one side in terms of the vertical direction are positioned in such a manner that the centers thereof oppose, in the vertical direction, the centers of the coil loops arranged on the other side, while the axis of the circular cylinder of the gradient coil 2 is interposed therebetween. Further, while an electric current is flowing, the Y-coil 2Y is configured to generate the gradient magnetic field along the vertical direction orthogonal to the axis of the circular cylinder of the gradient coil 2, by generating magnetic fluxes each penetrating the coil loops opposing each other.

In this situation, for example, the gradient coil 2 is an Actively Shielded Gradient Coil (ASGC). The ASGC includes a main coil configured to generate a gradient magnetic field and a shield coil configured to cancel out a stray magnetic field. The shield coil is arranged to surround the main coil and is configured to generate a shielding-purpose magnetic field for cancelling out the stray magnetic field. In the ASGC, each of the main and the shield coils includes the X-coil, the Y-coil, and the Z-coil described above.

Returning to the description of FIG. 1, by individually supplying an electric current to each of the X-, Y-, and Z-coils included in the gradient coil 2, the gradient power source 3 is configured to cause the gradient magnetic fields to be generated along the X-, Y-, and Z-axes, respectively, in the space formed inside the gradient coil 2.

By generating the gradient magnetic fields along the X-, Y-, and Z-axes in this manner, the gradient power source 3 is able to cause the gradient magnetic fields to be generated along a read-out direction, a phase-encoding direction, and a slice direction. The axes extending along the read-out direction, the phase-encoding direction, and the slice direction structure a logical coordinate system used for defining slice regions or a volume region serving as a target of an imaging process. In the following sections, the gradient magnetic field generated along the read-out direction will be referred to as a read-out gradient magnetic field; the gradient magnetic field generated along the phase-encoding direction will be referred to as a phase-encoding gradient magnetic field; and the gradient magnetic field generated along the slice direction will be referred to as a slice gradient magnetic field.

The gradient magnetic fields are superimposed on the static magnetic field generated by the static magnetic field magnet 1 and are used for appending spatial position information to magnetic resonance (MR) signals. More specifically, the read-out gradient magnetic field appends position information along the read-out direction to an MR signal, by varying the frequency of the MR signal in accordance with the position in the read-cut direction. Further, the phase-encoding gradient magnetic field appends position information in the phase-encoding direction to an MR signal, by varying the phase of the MR signal along the phase-encoding direction. Further, when an imaging region is represented by slice regions, the slice gradient magnetic field is used for determining the orientations, the thicknesses, and the quantity of the slice regions. In contrast, when an imaging region is represented by a volume region, the slice gradient magnetic field appends position information along the slice direction to an MR signal, by varying the phase of the MR signal in accordance with the position in the slice direction.

The transmitter coil 4 is arranged on the inside of the gradient coil 2 and is configured to apply a Radio Frequency (RF) magnetic field to the imaging space in which the subject S is placed. More specifically, the transmitter coil 4 is formed to have a hollow and substantially circular cylindrical shape (which may have an oval cross-section orthogonal to the central axis thereof) and is configured, on the basis of an RF pulse signal output from the transmitter circuitry 5, to apply the RF magnetic field to the space on the inside of the circular cylinder.

The transmitter circuitry 5 is configured to output the RF pulse signal corresponding to a Larmor frequency to the transmitter coil 4.

The receiver coil 6 is an RF coil configured to receive MR signals emitted from the subject S. For example, the receiver coil 6 is attached to the subject S placed on the inside of the transmitter coil 4 and is configured to receive the MR signals emitted from the subject. S due to an influence of the RF magnetic fields applied by the transmitter coil 4. Further, the receiver coil 6 is configured to output the received MR signals to the receiver circuitry 7. For example, as the receiver coil 6, a coil dedicated for each of the various sites serving as targets of imaging processes is used. In this situation, examples of the coils dedicated for the various sites include a receiver coil for the head, a receiver coil for the neck, a receiver coil for a shoulder, a receiver coil for the chest, a receiver coil for the abdomen, a receiver coil for a leg, and a receiver coil for the spine.

The receiver circuitry 7 is configured to generate MR signal data on the basis of the MR signals output from the receiver coil 6 and to output the generated MR signal data to the processing circuitry 14.

In the present example, the situation in which the transmitter coil 4 applies the RF magnetic field so that the receiver coil 6 receives the MR signals is explained; however, possible embodiments of the RF coils are not limited to this example. For instance, the transmitter coil 4 may further have a receiving function to receive the MR signals. Further, the receiver coil 6 may further have a transmitting function to apply the RF magnetic field. When the transmitter coil 4 has the receiving function, the receiver circuitry 7 generates MR signal data also from the MR signals received by the transmitter coil 4. Further, when the receiver coil 6 has the transmitting function, the transmitter circuitry 5 outputs an RF pulse signal also to the receiver coil 6.

The gantry 8 houses therein the static magnetic field magnet 1, the gradient coil 2, and the transmitter coil 4. More specifically, the gantry 8 has a bore B that is hollow and is formed to have a circular cylindrical shape. The static magnetic field magnet 1, the gradient coil 2, and the transmitter coil 4 are housed in the gantry 8, while being disposed so as to surround the bore B. In this situation, the space formed on the inside of the bore B of the gantry 8 corresponds to the imaging space in which the subject S is placed when an imaging process is performed on the subject S.

The couch 9 includes a couchtop 9a on which the subject S is placed. When an imaging process is performed on the subject S, the couchtop 9a is inserted to the inside of the bore B of the gantry 8. For example, the couch 9 is installed in such a manner that the longitudinal direction thereof extends parallel to the central axis of the static magnetic field magnet 1.

The input interface 10 is configured to receive operations to input various types of instructions and various types of information from the operator. More specifically, the input interface 10 is connected to the processing circuitry 16 and is configured to convert the input operations received from the operator into electrical signals and to output the electrical signals to a controlling circuit. For example, the input interface 10 is realized by using a trackball, a switch button, a mouse, a keyboard, a touchpad on which an input operation can be performed by touching the operation screen thereof, a touch screen in which a display screen and a touchpad are integrally formed, a contactless input interface using an optical sensor, an audio input interface, and/or the like that are used for setting an imaging condition and a Region of Interest (ROI). In the present disclosure, possible embodiments of the input interface 10 are not limited to those including physical operation component parts such as a mouse and/or a keyboard. Possible examples of the input interface 10 include an electrical signal processing circuit configured to receive an electrical signal corresponding to an input operation from an external input device provided separately from the apparatus and to output the received electrical signal to a controlling circuit.

The display 11 configured to display various types of information and various types of images. More specifically, the display 11 is connected to the processing circuitry 16 and is configured to convert the various types of information and data of the various types of images sent thereto from the processing circuitry 16, into display-purpose electrical signals and to output the display-purpose electrical signals. For example, the display 11 is realized by using a liquid crystal monitor, a Cathode Ray Tube (CRT) monitor, a touch panel, or the like.

The storage 12 is configured to store various types of data therein. More specifically, the storage 1 is configured to store therein the MR signal data and image data. For example, the storage 12 is realized by using a semiconductor memory element such as a Random Access Memory (RAM), a flash memory, or the like, or a hard disk, an optical disk, or the like.

The processing circuitry 13 includes a couch controlling function 13a. For example, the processing circuitry 13 is realized by using a processor. The couch controlling function 13a is connected to the couch 9 and is configured to control operations of the couch 9 by outputting a control-purpose electrical signal to the couch 9. For example, the couch controlling function 13a receives, via the input interface 10, an instruction to move the couchtop 9a in a longitudinal direction, an up-and-down direction, or a left-and-right direction from the operator and operates a driving mechanism for the couchtop 9a included in the couch 9 so as to move the couchtop 9a according to the received instruction.

The processing circuitry 14 includes an executing function 14a. The executing function 14a is configured to perform a data acquisition to acquire the MR signal data by driving the gradient power source 3, the transmitter circuitry 5, and the receiver circuitry 7, on the basis of sequence execution data output from the processing circuitry 16. In this situation, the sequence execution data is information that defines a pulse sequence indicating a procedure performed to acquire the MR signal data. More specifically, the sequence execution data is information that defines: the timing with which the electric current is to be supplied from the gradient power source 3 to the gradient coil 2 and the intensity of the electric current to be supplied; the intensity of the RF pulse signal to be supplied from the transmitter circuitry 5 to the transmitter coil 4 and the timing with which the RF pulse signal is to be supplied; the timing with which the MR signals are to be detected by the receiver circuitry 7, and the like. For example, the processing circuitry 14 is realized by using a processor.

Further, the executing function 14a is configured to receive the MR signal data from the receiver circuitry 7 as a result of executing various types of pulse sequences and to store the received MR signal data into the storage 12. A set made up of pieces of MR signal data received by the executing function 14a is stored in the storage 12 as data structuring a k-space as a result of being arranged two-dimensionally or three-dimensionally according to the position information appended by the read-out gradient magnetic field, the phase-encoding gradient magnetic field, and the slice gradient magnetic field described above.

The processing circuitry 15 includes an image generating function 15a. The image generating function 15a is configured to generate an image on the basis of the MR signal data stored in the storage 12. More specifically, the image generating function 15a generates the image by reading the MR signal data stored into the storage 12 by the executing function 14a and further performing a reconstructing process such as a post-processing process (i.e., a Fourier transform or the like) on the read MR signal data. Further, the image generating function 15a stores image data of the generated image into the storage 12. For example, the processing circuitry 15 is realized by using a processor.

The processing circuitry 16 is configured to exercise overall control of the MRI apparatus 100 by controlling constituent elements of the MRI apparatus 100. For example, the processing circuitry 16 receives, from the operator, an input of various types of parameters related to the pulse sequence via the input interface 10 and sets an imaging condition on the basis of received input values of the various types of parameters. Further, the processing circuitry 16 generates the sequence execution data on the basis of the imaging condition and executes various types of pulse sequences by transmitting the generated sequence execution data to the processing circuitry 14. Further, for example, the processing circuitry 16 reads the image data of an image requested by the operator from the storage 12 and outputs the read image to the display 11. For example, the processing circuitry 16 is realized by using a processor.

In this situation, the constituent elements of the MRI apparatus 100 described above are provided as being separated into an imaging room 200 and an operating room 300, for example. The imaging room 200 is a shielded room where the space on the inside is shielded from electromagnetic wave noise occurring on the outside thereof, and also, electromagnetic wave noise occurring on the inside thereof is prevented from leaking to the outside. More specifically, the static magnetic field magnet 1, the gradient coil 2, the transmitter coil 4, the receiver coil 6, the gantry 8, and the couch 9 are provided in the imaging room 200. The gradient power source 3, the transmitter circuitry 5, the receiver circuitry 7, the input interface 10, the display 11, the storage 12, and the processing circuitries 13 to 16 are provided in the operating room 300.

An overall configuration of the MRI apparatus 100 according to the first embodiment has thus been explained. The MRI apparatus 100 according to the first embodiment structured as described above has a configuration used for cooling the gradient coil 2. Further, in the first embodiment, the MRI apparatus 100 is configured to be able to optimize cooled locations in accordance with a distribution of heat generation of the gradient coil 2.

More specifically, the MRI apparatus 100 includes a first cooling pipe, a second cooling pipe, and a switcher. The first cooling pipe is configured to cool the gradient coil 2 entirely, whereas the second cooling pipe is configured to locally cool the gradient coil 2. Further, the switcher is configured to switch the state of refrigerant supplied to the first cooling pipe and to the second cooling pipe. Further, the MRI apparatus 100 further includes a chiller configured to change one of the flow volume and the temperature of the refrigerant.

Figure 4:
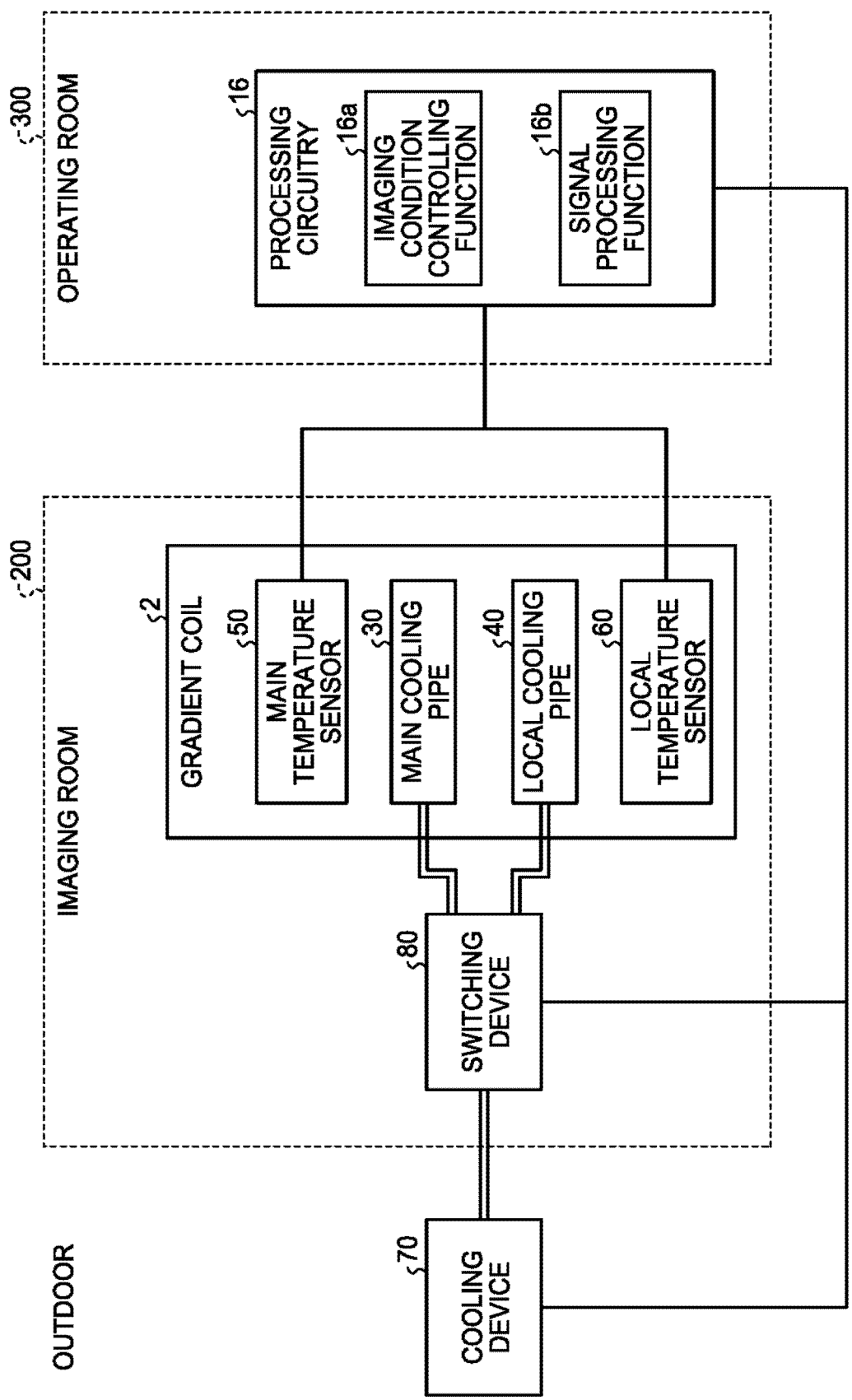
FIG. 4 is a diagram illustrating an exemplary configuration used for cooling the gradient coil included in the MRI apparatus according to the first embodiment.

FIG. 4 is a diagram illustrating an exemplary configuration used for cooling the gradient coil 2 included in the MRI apparatus 100 according to the first embodiment. For the sake of convenience in the explanation, among the constituent elements of the MRI apparatus 100 illustrated in FIG. 1, the constituent elements other than the gradient coil 2 and the processing circuitry 16 are omitted from FIG. 4.

For example, as illustrated in FIG. 4, the MRI apparatus 100 includes a main cooling pipe 30, a local cooling pipe 40, a main temperature sensor 50, a local temperature sensor 60, a chiller 70, and a switcher 80. In this situation, for example, the switcher 80 is provided in the imaging room 200, whereas the chiller 70 is provided outdoor. Further, the main cooling pipe 30 in the present embodiment is an example of the first cooling pipe. The local cooling pipe 40 in the present embodiment is an example of the second cooling pipe. The chiller 70 in the present embodiment is an example of the chiller.

The main cooling pipe 30 is configured to cool the gradient coil 2 entirely.

Figure 5:
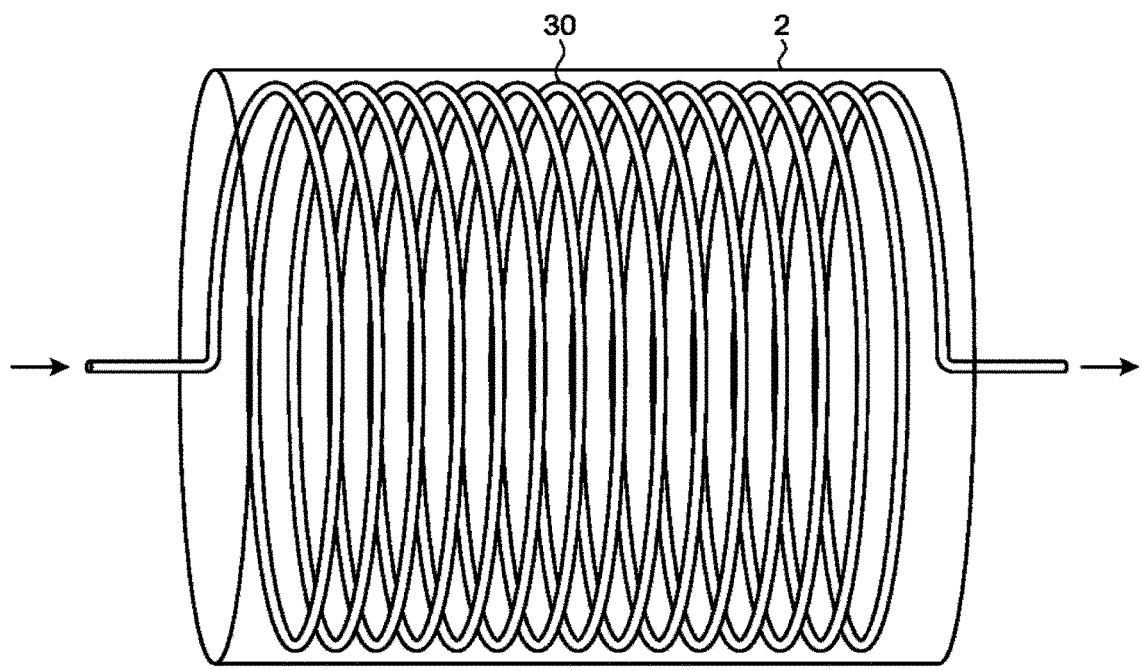
FIG. 5 is a drawing illustrating an example of a main cooling pipe according to the first embodiment.

FIG. 5 is a drawing illustrating an example of the main cooling pipe 30 according to the first embodiment. For example, as illustrated in FIG. 5, the main cooling pipe 30 is formed to have a helical shape and is provided in substantially the entirety of the gradient coil 2 along the circular cylindrical shape of the gradient coil 2. In this situation, for example, the main cooling pipe 30 is embedded in the resin filling the inside of the gradient coil 2 so as to surround the X-coil, the Y-coil, and the Z-coil for the purpose of fixing the positions of these coils.

For example, the main cooling pipe 30 has an inlet for the refrigerant on the side of one end (i.e., the left side in FIG. 5) in terms of the axial direction of the gradient coil 2, and has an outlet for the refrigerant on the side of the other end (i.e., the right side in FIG. 5). Further, the main cooling pipe 30 is arranged in such a manner that the refrigerant that has flowed in through the inlet is caused to circulate along the helical path within the gradient coil 2, before being discharged through the outlet.

Although FIG. 5 illustrates the example in which the main cooling pipe 30 is structured with the single cooling pipe formed to have the helical shape, possible embodiments are not limited to this example. For instance, the main cooling pipe 30 may be structured by arranging a plurality of cooling pipes parallel to one another while each of the cooling pipes is formed have a helical shape. Further, although FIG. 5 illustrates the example in which the main cooling pipe 30 has the inlet for the refrigerant on the side of the one end in terms of the axial direction of the gradient coil 2 and has the outlet for the refrigerant on the side of the other end, possible embodiments are not limited to this example. For instance, the main cooling pipe 30 may be structured in such a manner that both the inlet and the outlet for the refrigerant are arranged on the side of the same end in terms of the axial direction of the gradient coil 2. Further, when the gradient coil 2 is configured with an ASGC, the main cooling pipe 30 may be provided for each of the main and the shield coils.

The local cooling pipe 40 is configured to locally cool the gradient coil 2.

More specifically, the local cooling pipe 40 is configured to locally cool such a section of the gradient coil 2 that generates more heat than other sections. In other words, the local cooling pipe 40 is arranged in such a section of the gradient coil 2 that generates a large amount of heat. For example, the local cooling pipe 40 is arranged densely in such a section of the gradient coil 2 that has a large number of interlinks of the magnetic flux. Further, the local cooling pipe 40 is linearly arranged in the portion positioned between at least one end of the gradient coil 2 and the section that has the large number of interlinks of the magnetic flux.

Generally, in saddle coils, a central part of each coil loop has the most interlinks of the magnetic flux. As a result, the central parts of the coil loops are expected to generate a large amount of heat. For this reason, in the first embodiment, the local cooling pipe 40 is arranged densely at a central part of each of the coil loops of the X-coil 2X and the Y-coil 2Y.

Figure 6:
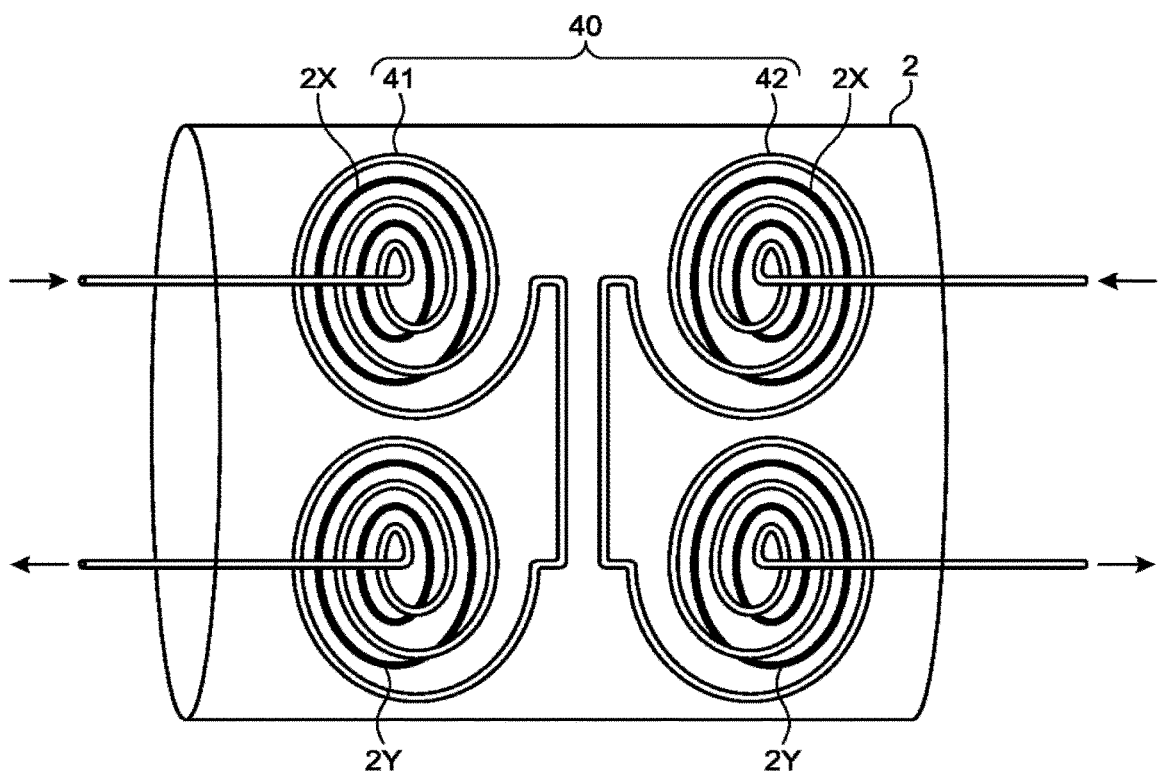
FIG. 6 is a drawing illustrating an example of a local cooling pipe according to the first embodiment.

FIG. 6 is a drawing illustrating an example of the local cooling pipe 40 according to the first embodiment. For the sake of convenience in the explanation, with respect to each of the X-coil 2X and the Y-coil 2Y included in the gradient coil 2, FIG. 6 schematically illustrates the two coil loop that are positioned on the same side of the axis of the gradient coil 2, in terms of either the horizontal direction or the vertical direction.

For example, as illustrated in FIG. 6, the local cooling pipe 40 includes a first local cooling pipe 41 arranged on the side of one end (i.e., the left side in FIG. 6) in terms of the axial direction of the gradient coil 2 and a second local cooling pipe 42 arranged on the side of the other end (i.e., the right side in FIG. 6). In this situation, for example, the first local cooling pipe 41 and the second local cooling pipe 42 are embedded in the resin filling the inside of the gradient coil 2 so as to surround the X-coil, the Y-coil, and the Z-coil for the purpose of fixing the positions of these coils.

The first local cooling pipe 41 has an inlet and an outlet for the refrigerant on the side of the one end in terms of the axial direction of the gradient coil 2. Further, the first local cooling pipe 41 is arranged in such a manner that the refrigerant that has flowed in through the inlet is circulated through the vicinity of such coil loops included in the X-coil 2X that are arranged on the side of the one end in terms of the axial direction of the gradient coil 2 and through the vicinity of such coil loops included in the Y-coil 2Y that are arranged on the side of the one end in terms of the axial direction of the gradient coil 2 in the stated order, before being discharged rough the outlet.

In this situation, the first local cooling pipe 41 is linearly arranged in the portions positioned between the one end in terms of the axial direction of the gradient coil 2 and the center of each of the coil loops. In the vicinity of the center of each of the coil loops, the first local cooling pipe 41 is arranged in a vortex formation that gradually spreads from the center of the coil loop outwardly. In other words, the first local cooling pipe 41 is arranged densely in such sections that have the large number of interlinks of the magnetic flux, on the side of the one end in terms of the axial direction of the gradient coil 2.

In contrast, the second local cooling pipe 42 has an inlet and an outlet for the refrigerant on the side of the other end in terms of the axial direction of the gradient coil 2. Further, the second local cooling pipe 42 is arranged in such a manner that the refrigerant that has flowed in through the inlet is circulated through the vicinity of such coil loops included in the X-coil 2X that are arranged on the side of the other end in terms of the axial direction of the gradient coil 2 and through the vicinity of such coil loops included in the Y-coil 2Y that are arranged on the side of the other end in terms of the axial direction of the gradient coil 2 in the stated order, before being discharged through the outlet.

In this situation, the second local cooling pipe 42 is linearly arranged in the portions positioned between the other end in terms of the axial direction of the gradient coil 2 and the center of each of the coil loops. In the vicinity of the center of each of the coil loops, the second local cooling pipe 42 is arranged in a vortex formation that gradually spreads from the center of the coil loop outwardly. In other words, the second local cooling pipe 42 is arranged densely in such sections that have the large number of interlinks of the magnetic flux, on the side of the other end in terms of the axial direction of the gradient coil 2.

In this manner, the first local cooling pipe 41 and the second local cooling pipe 42 are each arranged densely in such sections of the gradient coil 2 that have the large number of interlinks of e magnetic flux. Accordingly, it is possible to cool the gradient coil 2 while prioritizing such sections of the gradient coil 2 that generate more heat than other sections.

The main temperature sensor 50 is configured to measure an overall temperature of the gradient coil 2.

For example, the main temperature sensor 50 is provided either at the outlet or in the vicinity of the outlet of the main cooling pipe 30 and is configured to measure the temperature of the refrigerant flowing out through the main cooling pipe 30. Alternatively, the main temperature sensor 50 may be provided in a section exhibiting an average temperature occurring from the gradient coil 2 and configured to measure the temperature of such a section. In another example, the main temperature sensor 50 may be configured to detect the temperatures of a plurality of sections of the gradient coil 2 and to calculate an average value of the detected temperatures as the overall temperature of the gradient coil 2.

The local temperature sensor 60 is configured to measure a local temperature of the gradient coil 2.

For example, the local temperature sensor 60 is provided either at the outlet or in the vicinity of the outlet of the local cooling pipe 40 and is configured to measure the temperature of the refrigerant flowing out through the local cooling pipe 40. Alternatively, the local temperature sensor 60 may be configured to measure the temperature of one or more sections in which the local cooling pipe 40 is arranged densely. In other words, in that situation, the local temperature sensor 60 is configured to measure the temperature of such a section of the gradient coil 2 that generates more heat than other sections. For example, the local temperature sensor 60 measures the temperature of such a section of the gradient coil 2 that has a large number of interlinks of the magnetic flux. In another example, the local temperature sensor 60 measures the temperature in the vicinity of the center of each of the coil loops of the X-coil 2X and the Y-coil 2Y.

The chiller 70 is configured to change the flow volume of the refrigerant supplied to the main cooling pipe 30 and to the local cooling pipe 40.

More specifically, the chiller 70 supplies the refrigerant (e.g., cooling water) to the main cooling pipe 30 and to the local cooling pipe 40 via the switcher 80. Further, on the basis of a control signal transmitted thereto from the processing circuitry 16, the chiller 70 changes the flow volume of the refrigerant supplied to the main cooling pipe 30 and to the local cooling pipe 40.

In the first embodiment, the chiller 70 changes the flow volume of the refrigerant supplied to the main cooling pipe 30 and to the local cooling pipe 40 on the basis of the imaging condition. Also, in the first embodiment, the chiller 70 changes the flow volume of the refrigerant supplied to the main cooling pipe 30 and to the local cooling pipe 40 on the basis of the temperature of the gradient coil 2.

The switcher 80 is configured to switch the state of the refrigerant supplied to the main cooling pipe 30 and to the local cooling pipe 40.

More specifically, the switcher 80 distributes the refrigerant supplied thereto from the chiller 70, to the main cooling pipe 30 and to the local cooling pipe 40. Further, on the basis of a control signal transmitted thereto from the processing circuitry 16, the switcher 80 switches the state of the refrigerant supplied to the main cooling pipe 30 and to the local cooling pipe 40.

In the first embodiment, the switcher 80 switches the flow volume ratio between the refrigerant supplied to the main cooling pipe 30 and the refrigerant supplied to the local cooling pipe 40, on the basis of the imaging condition. Also, in the first embodiment, the switcher 80 switches the flow volume ratio between the refrigerant supplied to the main cooling pipe 30 and the refrigerant supplied to the local cooling pipe 40, on the basis of the temperature of the gradient coil 2.

In this regard, in the first embodiment, to control the chiller 70 and the switcher 80 described above, the processing circuitry 16 includes an imaging condition controlling function 16a and a signal processing function 16b. In this situation, for example, the imaging condition controlling function 16a and the signal processing function 16b are configured to control the flow volume of the refrigerant to be circulated through the local cooling pipe 40. In the first embodiment, the imaging condition controlling function 16a and the signal processing function 16b are examples of a controller. In the present example, the controller of the present disclosure may be realized by a combination of hardware such as one or more circuits and software.

On the basis of the imaging condition, the imaging condition controlling function 16a is configured to control the chiller 70 and the switcher 80 before the imaging process is started.

More specifically, the imaging condition controlling function 16a sets the imaging condition on the basis of the input values of the various types of parameters received from the operator. Further, on the basis of the imaging condition that was set, the imaging condition controlling function 16a determines the flow volume of the refrigerant supplied by the chiller 70 and the flow volume ratio between the refrigerant supplied to the main cooling pipe 30 and the refrigerant supplied to the local cooling pipe 40 by the switcher 80.

For example, the imaging condition controlling function 16a is configured to predict, on the basis of the imaging condition, an overall heat generation amount and a local heat generation amount occurring in the gradient coil 2 during the imaging process. As one example, the heat generation amounts of the X-coil and the Y-coil during an imaging process are expected to be larger, for example, during such an imaging process in which read-out gradient magnetic fields having opposite polarities are alternately applied repeatedly like in an Echo Planar Imaging (EPI) scheme or during such an imaging process in which gradient magnetic fields in mutually-different directions are alternately applied repeatedly like Motion Probing Gradient (MPG) pulses used in a Diffusion Weighted imaging (DWI) scheme, compared to during imaging processes using other imaging methods. When such an imaging condition is set that is expected to increase the heat generation amounts of the X-coil or the Y-coil during the imaging process, the imaging condition controlling function 16a predicts that the local heat generation amount occurring in the gradient coil 2 during the imaging process will be larger than the overall heat generation amount.

After that, on the basis of the overall heat generation amount and the local heat generation amount that were predicted, the imagine condition controlling function 16a determines the flow volume of the refrigerant supplied by the chiller 70 and the flow volume ratio between the refrigerant supplied to the main cooling pipe 30 and the refrigerant supplied to the local cooling pipe 40 by the switcher 80, in such a manner that the overall temperature and the local temperature of the gradient coil 2 during the imaging process will each be at a predetermined level.

Further, before the imaging process is started, the imaging condition controlling function 16a transmits a control signal indicating the determined flow volume of the refrigerant to the chiller 70 and also transmits a control signal indicating the determined flow volume ratio of the refrigerant to the switcher 80.

On the basis of temperature of the gradient coil 2, the signal processing function 16b is configured to control the chiller 70 and the switcher 80 during the imaging process.

More specifically, during the imaging process, the signal processing function 16b monitors the overall temperature and the local temperature of the gradient coil 2, on the basis of the temperature measured by the main temperature sensor 50 and the temperature measured by the local temperature sensor 60. Further, on the basis of the overall temperature and the local temperature of the gradient coil 2, the signal processing function 16b switches, in a real-time manner, the flow volume of the refrigerant supplied by the chiller 70 and the flow volume ratio between the refrigerant supplied to the main cooling pipe 30 and the refrigerant supplied to the local cooling pipe 40 by the switcher 80.

For example, on the basis of the temperature measured by the main temperature sensor 50 and the temperature measured by the local temperature sensor 60, the signal processing function 16b determines the flow volume of the refrigerant supplied by the chiller 70 and the flow volume ratio between the refrigerant supplied to the main cooling pipe 30 and the refrigerant supplied to the local cooling pipe 40 by the switcher 80, in such a manner that the overall temperature and the local temperature of the gradient coil 2 during the imaging process will each be at a predetermined level.

For example, when the temperature measured by the main temperature sensor 50 and the temperature measured by the local temperature sensor 60 are each higher than the predetermined level, the signal processing function 16b increases the flow volume of the refrigerant supplied by the chiller 70. On the contrary, when the temperature measured by the main temperature sensor 50 and the temperature measured by the local temperature sensor 60 are each lower than the predetermined level, the signal processing function 16b decreases the flow volume of the refrigerant supplied by the chiller 70.

Further, for example, when the temperature measured by the local temperature sensor 60 is higher than the temperature measured by the main temperature sensor 50, the signal processing function 16b increases the flow volume ratio of the refrigerant supplied to the local cooling pipe 40 by the switcher 80, so that the volume of the refrigerant flowing through the local cooling pipe 40 is larger than that flowing through the main cooling pipe 30. On the contrary, when the temperature measured by the main temperature sensor 50 is higher than the temperature measured by the local temperature sensor 60, the signal processing function 16b increases the flow volume ratio of the refrigerant supplied to the main cooling pipe 30 by the switcher 80, so that the volume of the refrigerant flowing through the main cooling pipe 30 is larger than that flowing through the local cooling pipe 40.

Further, the signal processing function 16b switches the flow volume and the flow volume ratio of the refrigerant by, in a real-time manner, transmitting a control signal indicating the determined flow volume of the refrigerant to the chiller 70 and also transmitting a control signal indicating the determined flow volume ratio of the refrigerant to the switcher 80. In this situation, the "real-time manner" does not necessarily have to be immediately in a strict sense. It is acceptable to have time lag in a tolerable range. Also, the timing may be defined for each time period of a predetermined length.

As explained above, the signal processing function 16b adjusts and optimizes the flow volume of the refrigerant supplied by the chiller 70 and the flow volume ratio between the refrigerant supplied to the main cooling pipe 30 and the refrigerant supplied to the local cooling pipe 40 by the switcher 80, so as to arrange the temperature of the gradient coil 2 to be at the predetermined level. As a result, it is possible to efficiently cool the gradient coil and to save electric power and the like required by the cooling process.

In this situation, for example, the processing procedures in the processes performed by the imaging condition controlling function 16a and the signal processing function 16b are stored in the storage 12 in the form of computer-executable programs. The processing circuitry 16 is a processor configured to realize the functions corresponding to the programs, by reading and executing the programs from the storage 12. In other words, the processing circuitry 16 that has read the programs has the functions illustrated within the processing circuitry 16 in FIG. 2.

FIG. 2 illustrates the example in which the imaging condition controlling function 16a and the signal processing function 16b included in the processing circuitry 16 are realized by the single processing circuitry, namely the processing circuitry 16; however, possible embodiments are not limited to this example. For instance, it is also acceptable to structure the processing circuitry 16 by combining together a plurality of independent processors, so that the functions are realized as a result of the processors executing the programs. Further, any of the processing functions of the processing circuitry 16 may be realized as being distributed to a plurality of processing circuits or being integrated into a single processing circuit, as appropriate. For example, the signal processing function 16b may be included in processing circuitry installed on a processing substrate provided in the imaging room.

Further, in the first embodiment above, the example is explained in which the single storage (i.e., the storage 12) stores therein the programs corresponding to the processing functions. However, another arrangement is also acceptable in which a plurality of storages are provided in a distributed manner, so that the processing circuitry 16 reads each of the corresponding programs from the individual storages.

Figure 7:
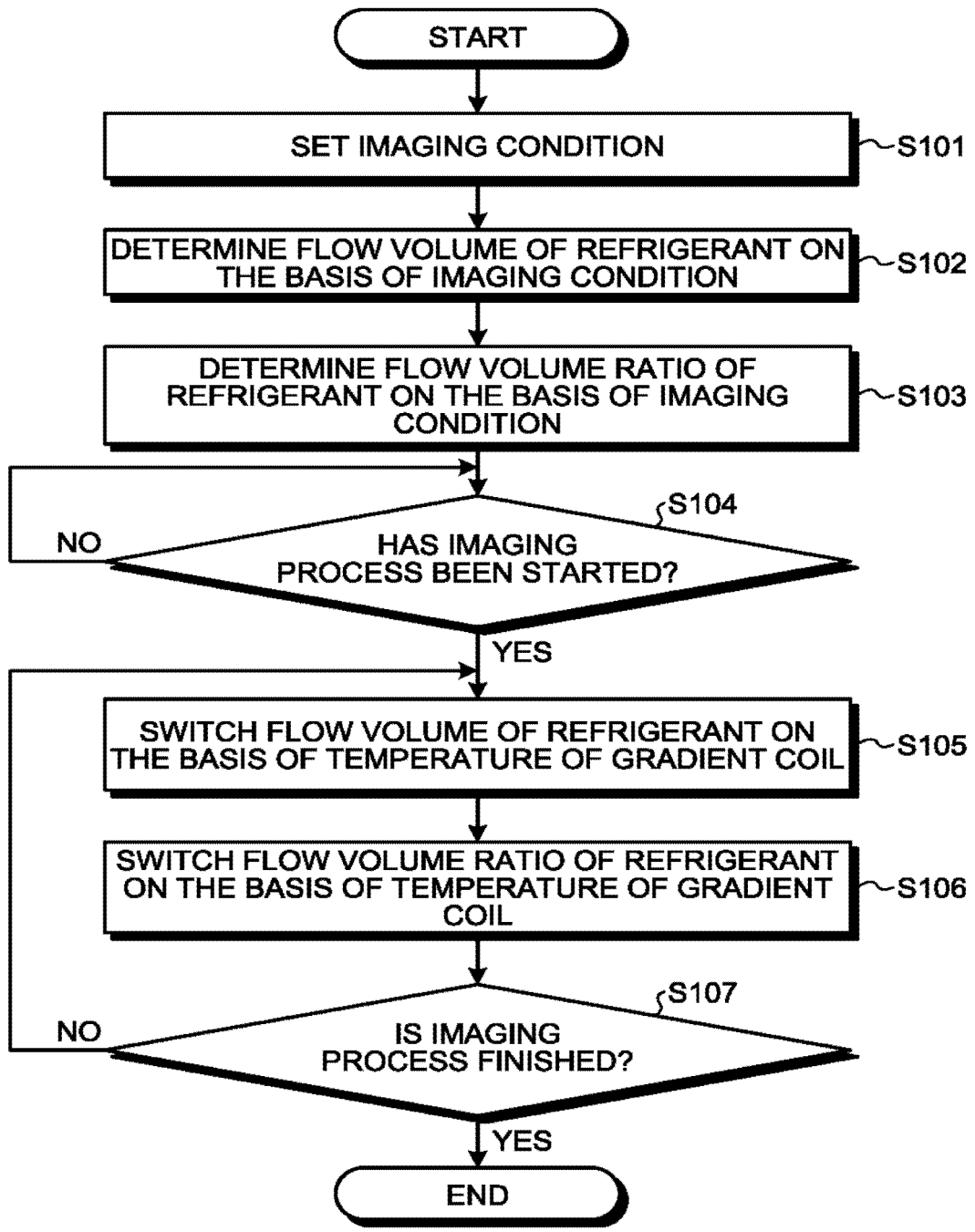
FIG. 7 is a flowchart illustrating a processing procedure in a process that is related to cooling the gradient coil and is performed by the MRI apparatus according to the first embodiment.

FIG. 7 is a flowchart illustrating a processing procedure in a process that is related to the cooling of the gradient coil and is performed by the MRI apparatus 100 according to the first embodiment. For example, as illustrated in FIG. 7, in the MRI apparatus 100 according to the first embodiment, the imaging condition controlling function 16a sets an imaging condition on the basis of the input values of the various types of parameters received from the operator (step S101).

Further, on the basis of the set imaging condition, the imaging condition controlling function 16a determines the flow volume of the refrigerant supplied by the chiller 70 (step S102). Further, on the basis of the set imaging condition, the imaging condition controlling function 16a determines the flow volume ratio between the refrigerant supplied to the main cooling pipe 30 and the refrigerant supplied to the local cooling pipe 40 by the switcher 80 step S103).

After that, when the imaging process is started (step S104: Yes), on the basis of the temperature of the gradient coil 2, the signal processing function 16b switches the flow volume of the refrigerant supplied by the chiller 70 (step S105). Further, on the basis of the temperature of the gradient coil 2, the signal processing function 16b switches the flow volume ratio between the refrigerant supplied to the main cooling pipe 30 and the refrigerant supplied to the local cooling pipe 40 by the switcher 80 (step S106).

Subsequently, until the imaging process is finishes (step S107: No), the signal processing function 16b repeatedly performs the processes at steps S105 and S106.

In this situation, the processes at steps S101 through S103 are realized, for example, as a result of the processing circuitry 16 invoking and executing the predetermined program corresponding to the imaging condition controlling function 16a from the storage 12. The processes at steps S104 through S107 are realized, for example, as a result of the processing circuitry 16 invoking and executing the predetermined program corresponding to the signal processing function 16b from the storage 12.

In FIG. 7, the processes performed by the imaging condition controlling function 16a to determine the flow volume of the refrigerant (step S102) and to determine the flow volume ratio of the refrigerant (step S103) may be performed in the reverse order or may be performed parallel to each other. Also, the processes performed by the signal processing function 16b to switch the flow volume of the refrigerant (step S105) and to switch the flow volume ratio of the refrigerant (step S106) may be performed in the reverse order or may be performed parallel to each other.

As explained above, in the first embodiment, the main cooling pipe 30 is configured to cool the gradient coil entirely, whereas the local cooling pipe 40 is configured to locally cool the gradient coil 2. Further, the switcher 80 is configured to switch the state of the refrigerant supplied to the main cooling pipe 30 and the refrigerant supplied to the local cooling pipe 40. With these arrangements, according to the first embodiment, it is possible to optimize the cooled locations in accordance with the distribution of the heat generation of the gradient coil.

Generally, in the gradient coil 2, which coils generate heat is dependent on the imaging condition. It is therefore expected that the locations where the heat is generated are unevenly present in the gradient coil 2. For this reason, for example, even when the entire gradient coil 2 is cooled by installing a cooling pipe in a helical formation in the circumferential direction of the gradient coil 2, there would be a temperature slope within the gradient coil 2.

In contrast, according to the first embodiment, it is possible to cool the gradient coil 2 while prioritizing such a section that generates more heat than other sections. It is therefore possible to reduce the temperature slope in the gradient coil 2. As a result, the cooling efficiency is improved, and it is therefore possible to extend the product life cycle of the gradient coil 2. In addition, because the temperature of the gradient coil 2 is lowered, it is possible to enhance the image quality. Furthermore, because it is possible to establish an imaging condition that is harsh on the temperature, it is possible to perform an imaging process that has conventionally been impossible.

Further, in the first embodiment described above, the example is explained in which the chiller 70 changes the flow volume of the refrigerant supplied to the main cooling pipe 30 and to the local cooling pipe 40; however possible embodiments are not limited to this example.

For instance, the chiller 70 may change the temperature of the refrigerant instead of changing the flow volume. Alternatively, the chiller 70 may change both the flow volume and the temperature. In that situation, the signal processing function 16b included in the processing circuitry 16 lowers the temperature of the refrigerant supplied by the chiller 70, when the temperature measured by the main temperature sensor 50 and the temperature measured by the local temperature sensor 60 are each higher than the predetermined level. On the contrary, the signal processing function 16b raises the temperature of the refrigerant supplied by the chiller 70, when the temperature measured by the main temperature sensor 50 and the temperature measured by the local temperature sensor 60 are each lower than the predetermined level.

In another example, the chiller 70 may change the flow rate of the refrigerant instead of changing the flow volume. In that situation, the signal processing function 16b included in the processing circuitry 16 increases the flow rate of the refrigerant supplied by the chiller 70, when the temperature measured by the main temperature sensor 50 and the temperature measured by the local temperature sensor 60 are each higher than a predetermined level. On the contrary, the signal processing function 16b decreases the flow rate of the refrigerant supplied by the chiller 70, when the temperature measured by the main temperature sensor 50 and the temperature measured by the local temperature sensor 60 are each lower than the predetermined level.

The first embodiment has thus been explained. It is also possible to carry out the first embodiment described above by modifying one or more of the constituent elements of the MRI apparatus 100 as appropriate. In the following sections, modification examples of the first embodiment will be explained as other embodiments. The following embodiments will be explained while a focus is placed on differences from the first embodiment. Detailed explanations of the configurations that are the same as those in the first embodiment or any other embodiment will be omitted.

Second Embodiment

For example, in the embodiment above, the example is explained in which the switcher 80 switches the flow volume ratio between the refrigerant supplied to the main cooling pipe 30 and the refrigerant supplied to the local cooling pipe 40; however, possible embodiments are not limited to this example. For instance, the switcher 80 may switch the flowing directions of the refrigerant supplied to the main cooling pipe 30 and to the local cooling pipe 40. Thus, examples with this configuration will be explained as a second embodiment.

In the second embodiment, for example, the imaging condition controlling function 16a included in the processing circuitry 16 is configured to switch, before the imaging process is started, the flowing directions of the refrigerant supplied to the main cooling pipe 30 and to the local cooling pipe 40 by the switcher 80, on the basis of the imaging condition. Further, in the second embodiment, for example, the signal processing function 16b included in the processing circuitry 16 is configured to switch, during the imaging process, the flowing directions of the refrigerant supplied to the main cooling pipe 30 and to the local cooling pipe 40 by the switcher 80, on the basis of the temperature of the gradient coil 2.

In the second embodiment, the main temperature sensor 50 is configured to measure, separately from each other, the temperature on the side of one end and the temperature on the side of the other end, in terms of the axial direction of the gradient coil 2. Further, in the second embodiment, the local temperature sensor 60 is configured to measure, separately from each other, the temperatures of the coil loops included in the X-coil 2X and the temperatures of the coil loops included in the Y-coil 2Y.

Figure 8:
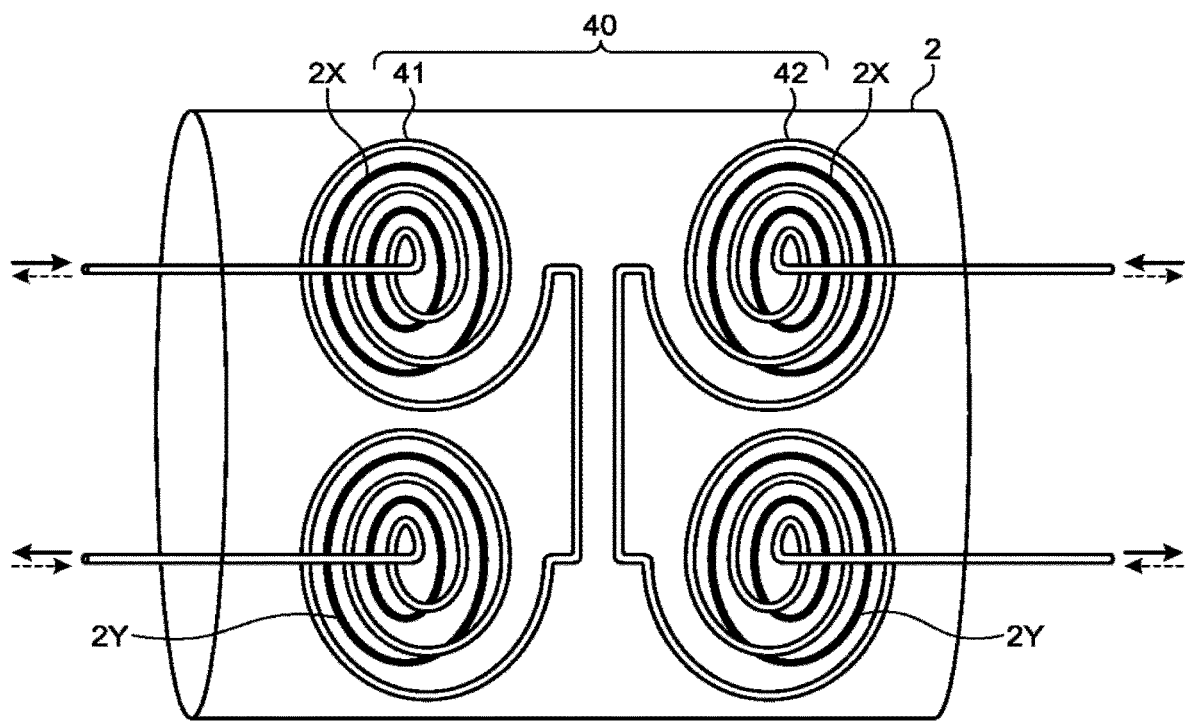
FIG. 8 is a drawing illustrating a method for controlling flows of refrigerant according to a second embodiment.

FIG. 8 is a drawing illustrating a method for controlling flows of refrigerant according to the second embodiment. Similarly to FIG. 6, for the sake of convenience in the explanation, with respect to the X-coil 2X and the Y-coil 2Y included in the gradient coil 2. FIG. 8 schematically illustrates the two coil loops that are positioned on the same side of the axis of the gradient coil 2, in terms of either the horizontal direction or the vertical direction.

For example, when the temperature of the X-coil 2X is expected to be higher than the temperature of the Y-coil 2Y during the imaging process on the basis of the imaging condition, the imaging condition controlling function 16a switches the flowing directions of the refrigerant supplied to the first local cooling pipe 41 and to the second local cooling pipe 42 by the switcher 80, in such a manner that the refrigerant flows through the vicinity of the coil loops included in the X-coil 2X and through the vicinity of the coil loops included in the Y-coil 2Y in the stated order (see the solid-line arrows in FIG. 8). On the contrary, when the temperature of the Y-coil 2Y is expected to be higher than the temperature of the X-coil 2X during the imaging process on the basis of the imaging condition, the imaging condition controlling function 16a switches the flowing directions of the refrigerant supplied to the first local cooling pipe 41 and to the second local cooling pipe 42 by the switcher 80, in such a manner that the refrigerant flows through the vicinity of the coil loops included in the Y-coil 2Y and through the vicinity of the coil loops included in the X-coil 2X in the stated order (see the dotted-line arrows in FIG. 8).

Further, for example, when the temperature of the X-coil 2X measured by the local temperature sensor 60 becomes higher than the temperature of the Y-coil 2Y during the imaging process, the signal processing function 16b switches the flowing directions of the refrigerant supplied to the first local cooling pipe 41 and to the second local cooling pipe 42 by the switcher 80, in such a manner that the refrigerant flows through the vicinity of the coil loops included in the X-coil 2X and through the vicinity of the coil loops included in the Y-coil 2Y in the stated or (see the solid-line arrows in FIG. 8). On the contrary, when the temperature of the Y-coil 2Y measured by the local temperature sensor 60 becomes higher than the temperature of the X-coil 2X during the imaging process, the signal processing function 16b switches the flowing directions of the refrigerant supplied to the first local cooling pipe 41 and to the second local cooling pipe 42 by the switcher 80, in such a manner that the refrigerant flows through the vicinity of the coil loops included in the Y-coil 2Y and through the vicinity of the coil loops included in the X-coil 2X in the stated order (see the dotted-line arrows in FIG. 8).

Further, for example, when the temperature on the side of one end in terms of the axial direction of the gradient coil 2 is expected to be higher than the temperature on the side of the other end during the imaging process on the basis of the imaging condition, the imaging condition controlling function 16a switches the flowing direction of the refrigerant supplied to the main cooling pipe 30 by the switcher 80, in such a manner that the refrigerant flows from the side of the one end to the side of the other end in terms of the axial direction of the gradient coil 2. On the contrary, when the temperature on the side of the other end in terms of the axial direction of the gradient coil 2 is expected to be higher than the temperature on the side of the one end during the imaging process on the basis of the imaging condition, the imaging condition controlling function 16a switches the flowing direction of the refrigerant supplied to the main cooling pipe 30 by the switcher 80, in such a manner that the refrigerant flows from the side of the other end to the side of the one end in terms of the axial direction of the gradient coil 2.

Further, for example, when the temperature on the side of one end in terms of the axial direction of the gradient coil 2 measured by the main temperature sensor 50 becomes higher than the temperature on the side of the other end during the imaging process, the signal processing function 16b switches the flowing direction of the refrigerant supplied to the main cooling pipe 30 by the switcher 80, in such a manner that the refrigerant flows from the side of the one end to the side of the other end in terms of the axial direction of the gradient coil 2. On the contrary, when the temperature on the side of the other end in terms of the axial direction of the gradient coil 2 measured by the main temperature sensor 50 becomes higher than the temperature on the side of the one end during the imaging process, the signal processing function 16b switches the flowing direction of the refrigerant supplied to the main cooling pipe 30 by the switcher 80, in such a manner that the refrigerant flows from the side of the other end to the side of the one end in terms of the axial direction of the gradient coil 2.

In this manner, in the second embodiment, by switching the flowing directions of the refrigerant supplied to the main cooling pipe 30 and to the local cooling pipe 40, it is possible to arrange the refrigerant to flow through such sections in the gradient coil 2 that generate a large amount of heat. As a result, when the locations where heat is generated are unevenly present in the gradient coil 2, it is possible to arrange colder refrigerant to flow through such sections in the gradient coil 2 that have high temperature. It is therefore possible to further enhance the cooling efficiency for the gradient coil 2.

Third Embodiment

In the embodiment described above, the example is explained in which the local cooling pipe 40 includes the first local cooling pipe 41 arranged on the side of the one end in terms of the axial direction of the gradient coil and the second local cooling pipe 42 arranged on the side of the other end (see FIGS. 6 and 8, for example); however, possible embodiments are not limited to this example. Thus, in the following sections, other examples related to configurations of the local cooling pipe 40 will be explained as a third embodiment.

Figure 9:
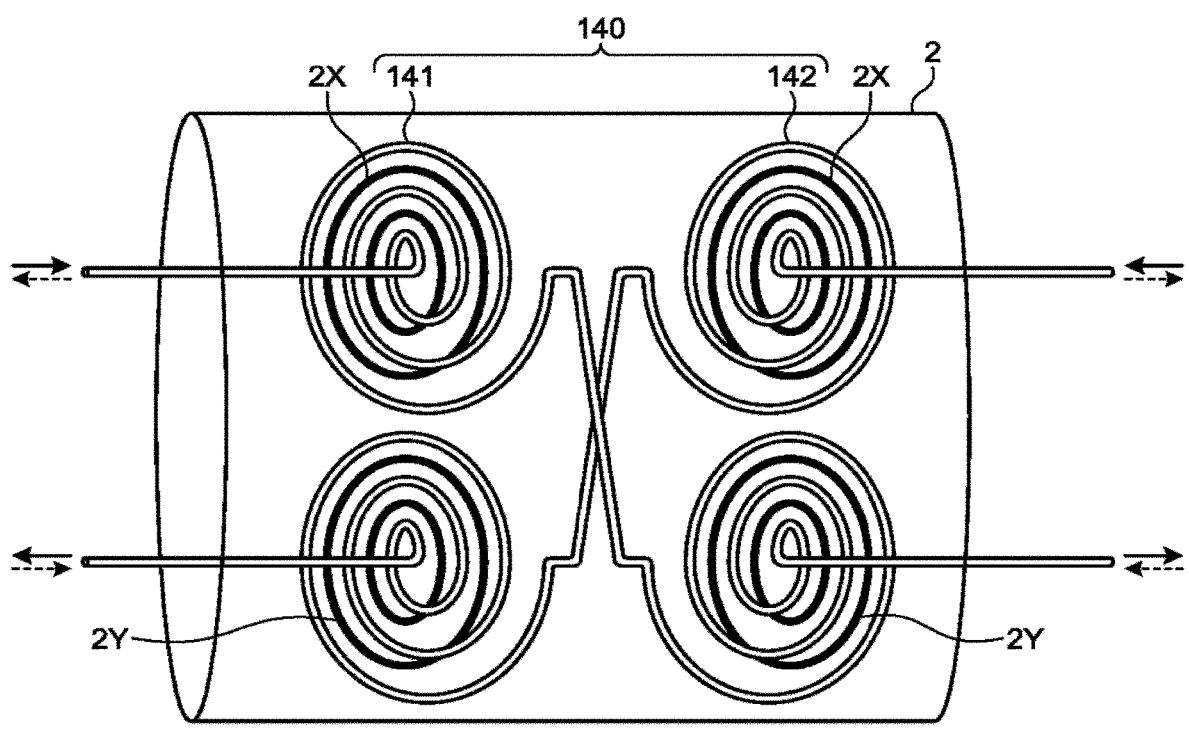
FIG. 9 is a drawing illustrating an example of a local cooling pipe according to a third embodiment.

FIG. 9 is a drawing illustrating an example of a local cooling pipe according to the third embodiment. In the example illustrated in FIG. 9, for instance, a local cooling pipe 140 includes a first local cooling pipe 141 and a second local cooling pipe 142 that are arranged so as to intersect each other in the vicinity of the center in terms of the axial direction of the gradient coil 2.

The first local cooling pipe 141 has an inlet for the refrigerant arranged on the side of one end in terms of the axial direction of the gradient coil 2 (i.e., the left side in FIG. 9) and has an outlet for the refrigerant on the side of the other end (i.e., the right side in FIG. 9). Further, the first local cooling pipe 141 is arranged in such a manner that the refrigerant that has flowed in through the inlet is circulated through the vicinity of such coil loops included in the X-coil 2X that are arranged on the side of the one end in terms of the axial direction of the gradient coil 2 and through the vicinity of such coil loops included in the Y-coil 2Y that are arranged on the side of the other end in terms of the axial direction of the gradient coil 2 in the stated order, before being discharged through the outlet (see the solid-line arrows in FIG. 9).

In contrast, the second local cooling pipe 142 has an inlet for the refrigerant arranged on the side of the other end in terms of the axial direction of the gradient coil (i.e., the right side in FIG. 9) and has an outlet for the refrigerant on the side of the one end (i.e., the left side in FIG. 9). Further, the second local cooling pipe 142 is arranged in such a manner that the refrigerant that has flowed in through the inlet is circulated through the vicinity of such coil loops included in the Y-coil 2Y that are arranged on the side of the other end in terms of the axial direction of the gradient coil 2 and through the vicinity of such coil loops included in the X-coil 2X that are arranged on the side of the one end in terms of the axial direction of the gradient coil 2 in the stated order, before being discharged through the outlet (see the solid-line arrows in FIG. 9).

Alternatively, in the example illustrated in FIG. 9, it is also acceptable, similarly to the second embodiment, to cause the switcher 80 to switch the flowing direction of the refrigerant supplied to the local cooling pipe 40, for instance. In that situation, when the temperature of the X-coil becomes higher than the temperature of the Y-coil during the imaging process, the imaging condition controlling function 16*a* and the signal processing function 16*b* switch the flowing directions of the refrigerant supplied to the first local cooling pipe 141 and to the second local cooling pipe 142 by the switcher 80, in such a manner that the refrigerant flows through the vicinity of the coil loops included in the X-coil 2X and through the vicinity of the coil loops included in the Y-coil 2Y in the stated order (see the solid-line arrows in FIG. 9). On the contrary, when the temperature of the Y-coil becomes higher than the temperature of the X-coil during the imaging process, the imaging condition controlling function 16*a* and the signal processing function 16*b* switch the flowing directions of the refrigerant supplied to the first local cooling pipe 141 and to the second local cooling pipe 142 by the switcher 80, in such a manner that the refrigerant flows through the vicinity of the coil loops included in the Y-coil 2Y and through the vicinity of the coil loops included in the X-coil 2X in the stated order (see the dotted-line arrows in FIG. 9).

As explained above, in the third embodiment also, it is possible to arrange the refrigerant to flow through such sections in the gradient coil 2 that generate a large amount of heat, by switching the flowing direction of the refrigerant supplied to the local cooling pipe 140. As a result, similarly to the second embodiment, when the locations where heat is generated are unevenly present in the gradient coil 2, it is possible to arrange colder refrigerant to flow through such sections in the gradient coil 2 that have high temperature. It is therefore possible to further enhance the cooling efficiency for the gradient coil 2.

Figure 10:
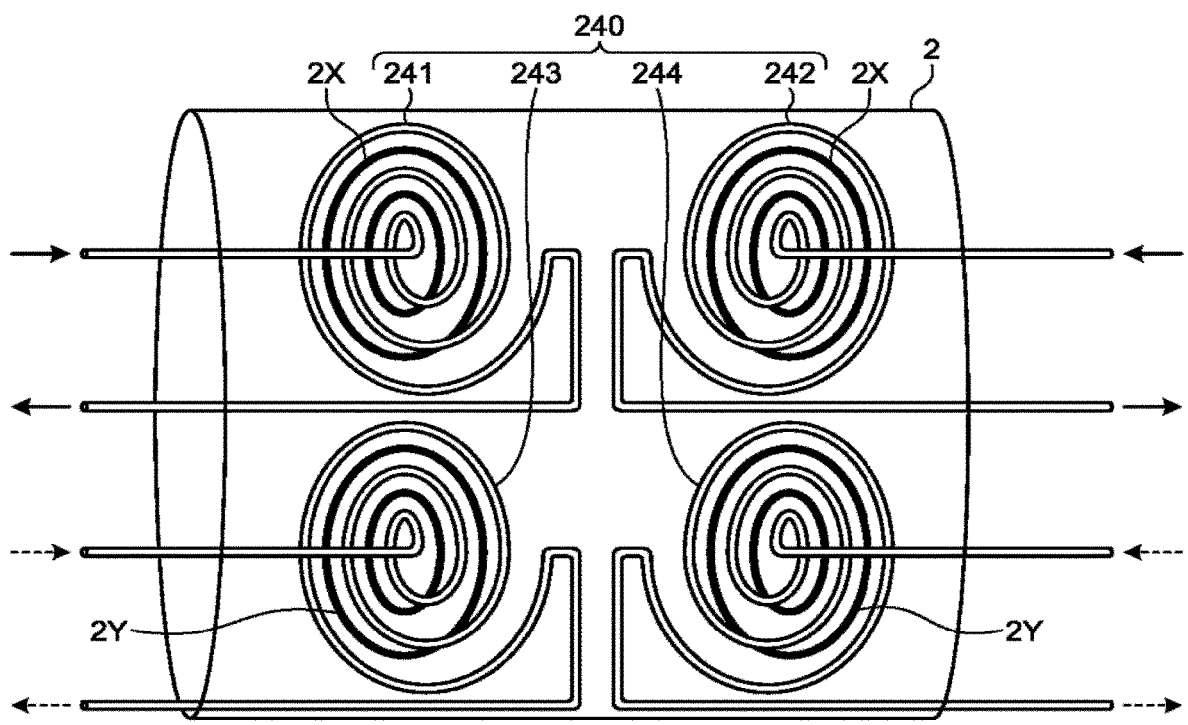
FIG. 10 is a drawing illustrating another example of the local cooling pipe according to the third embodiment.
Figure 11:
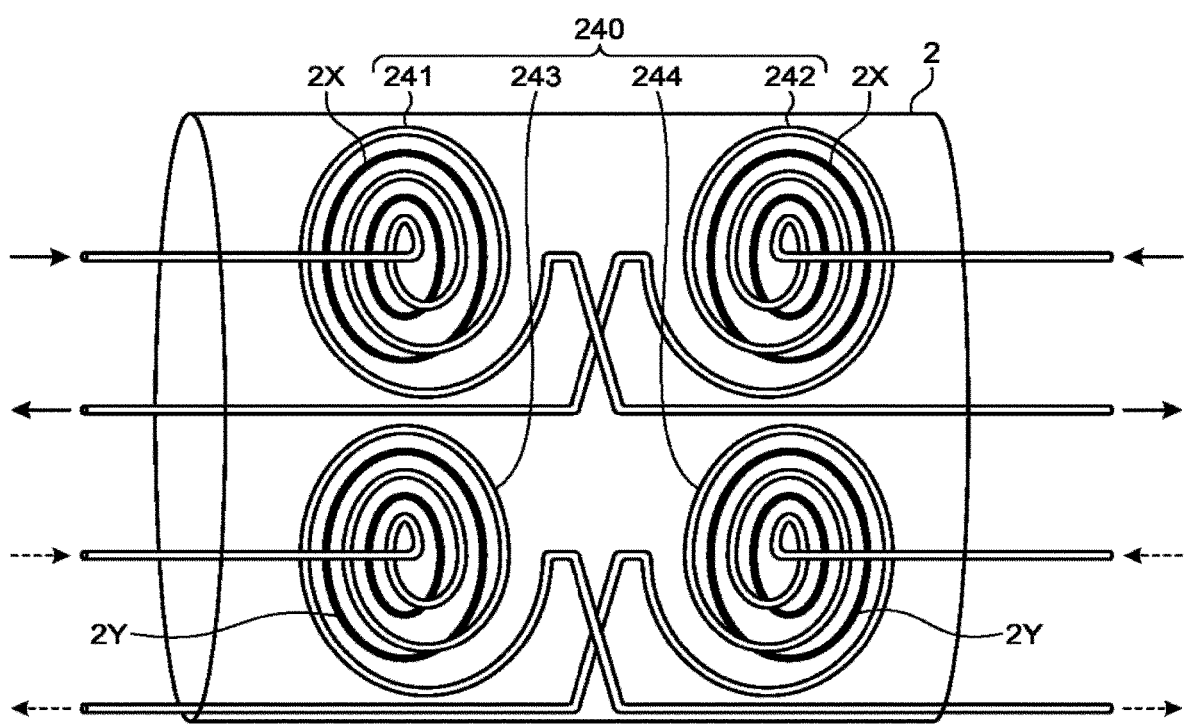
FIG. 11 is a drawing illustrating yet another example of the local cooling pipe according to the third embodiment.

FIGS. 10 and 11 are drawings illustrating other examples of the local cooling pipe according to the third embodiment. For instance, in the example in FIG. 10, a local cooling pipe 240 includes a first local cooling pipe 241 and a second local cooling pipe 242 that are arranged separately from each other in the vicinity of the coil loops included in the X-coil 2X, as well as a third local cooling pipe 243 and a fourth local cooling pipe 244 that are arranged separately from each other in the vicinity of the coil loops included in the Y-coil 2Y.

The first local cooling pipe 241 has an inlet and an outlet for the refrigerant on the side of one end in terms of the axial direction of the gradient coil 2 (i.e., the left side in FIG. 10). Further, the first local cooling pipe 241 is arranged in such a manner that the refrigerant that has flowed in through the inlet is circulated through the vicinity of such coil loops included in the X-coil 2X that are arranged on the side of the one end in terms of the axial direction of the gradient coil 2, before being discharged through the outlet (see the solid-line arrows in FIG. 10).

Further, the second local cooling pipe 242 has an inlet and an outlet for the refrigerant on the side of the other end in terms of the axial direction of the gradient coil 2 (i.e., the right side in FIG. 10). Further, the second local cooling pipe 242 is arranged in such a manner that the refrigerant that has flowed in through the inlet is circulated through the vicinity of such coil loops included in the X-coil 2X that are arranged on the side of the other end in terms of the axial direction be gradient coil 2, before being discharged through the outlet (see the solid-line arrows in FIG. 10).

In contrast, the third local cooling pipe 243 has an inlet and an outlet for the refrigerant on the side of the one end in terms of the axial direction of the gradient coil 2 (i.e., the left side in FIG. 10). Further, the third local cooling pipe 243 is arranged in such a manner that the refrigerant that has flowed in through the inlet is circulated through the vicinity of such coil loops included in the Y-coil 2Y that are arranged on the side of the one end in terms of the axial direction of the gradient coil 2, before being discharged through the outlet (see the dotted-line arrows in FIG. 10).

In addition, the fourth local cooling pipe 244 has an inlet and an outlet for the refrigerant on the side of the other end in terms of the axial direction of the gradient coil 2 (i.e., the right side in FIG. 10). Further, the fourth local cooling pipe 244 is arranged in such a manner that the refrigerant that has flowed in through the inlet is circulated through the vicinity of such coil loops included in the Y-coil 2Y that are arranged on the side of the other end in terms of the axial direction of the gradient coil 2, before being discharged through the outlet (see the dotted-line arrows in FIG. 10).

Alternatively, for example, as illustrated in FIG. 11, the first local cooling pipe 241 and the third local cooling pipe 243 may each have an outlet for the refrigerant on the side of the other end in terms of the axial direction of the gradient coil 2 (i.e., the right side in FIG. 11). Further, for example, as illustrated FIG. 11, the second local cooling pipe 242 and the fourth local cooling pipe 244 may each have an outlet for the refrigerant on the side of the one end in terms of the axial direction of the gradient coil (i.e., the left side in FIG. 11).

In this situation, in the example illustrated in FIG. 10 or 11, the switcher 80 may be configured to switch the flow volume ratio between the refrigerant supplied to the first local cooling pipe 241 and to the second local cooling pipe 242 and the refrigerant supplied to the third local cooling pipe 243 and to the fourth local cooling pipe 244. In that situation, when the temperature of the X-coil becomes higher than the temperature of the Y-coil during the imaging process, the imaging condition controlling function 16a and the signal processing function 16b increase the flow volume ratio of the refrigerant supplied to the first local cooling pipe 241 and to the second local cooling pipe 242 by the switcher 80, in such a manner that the volume of the refrigerant flowing through the first local cooling pipe 241 and through the second local cooling pipe 242 is larger than the volume of the refrigerant flowing through the third local cooling pipe 243 and through the fourth local cooling pipe 244 (see the solid-line arrows in FIGS. 10 and 11). On the contrary, when the temperature of the Y-coil becomes higher than the temperature of the X-coil during the imaging process, the imaging condition controlling function 16a and the signal processing function 16b increase the flow volume ratio of the refrigerant supplied to the third local cooling pipe 243 and to the fourth local cooling pipe 244 by the switcher 80, in such a manner that the volume of the refrigerant flowing through the third local cooling pipe 243 and through the fourth local cooling pipe 244 is larger than the volume of the refrigerant flowing through the first local cooling pipe 241 and through the second local cooling pipe 242 (see the dotted-line arrows in FIGS. 10 and 11).

In this manner, according to the third embodiment, it is possible to cool the gradient coil while prioritizing such sections of the gradient coil 2 where the temperature rises drastically, by switching the flow volume ratios for the refrigerant supplied to each of the plurality of local cooling pipes, in accordance with the heat generation amounts of the coils included in the gradient coil 2 with this arrangement, it is possible to further enhance the cooling efficiency for the gradient coil 2.

Fourth Embodiment

Further, in the embodiment described above, the example is explained in which the local cooling pipes are each arranged in the vortex formation that gradually spreads from the center of the coil loop outwardly, in the vicinity of the center of a corresponding one of the coil loops included in the X-coil 2X and the Y-coil 2Y (see FIGS. 6 and 8-11, for example). However, possible embodiments are not limited to this example. Thus, in the following sections, other examples related to positional arrangements of local cooling pipes will be explained as a fourth embodiment.

Figure 12:
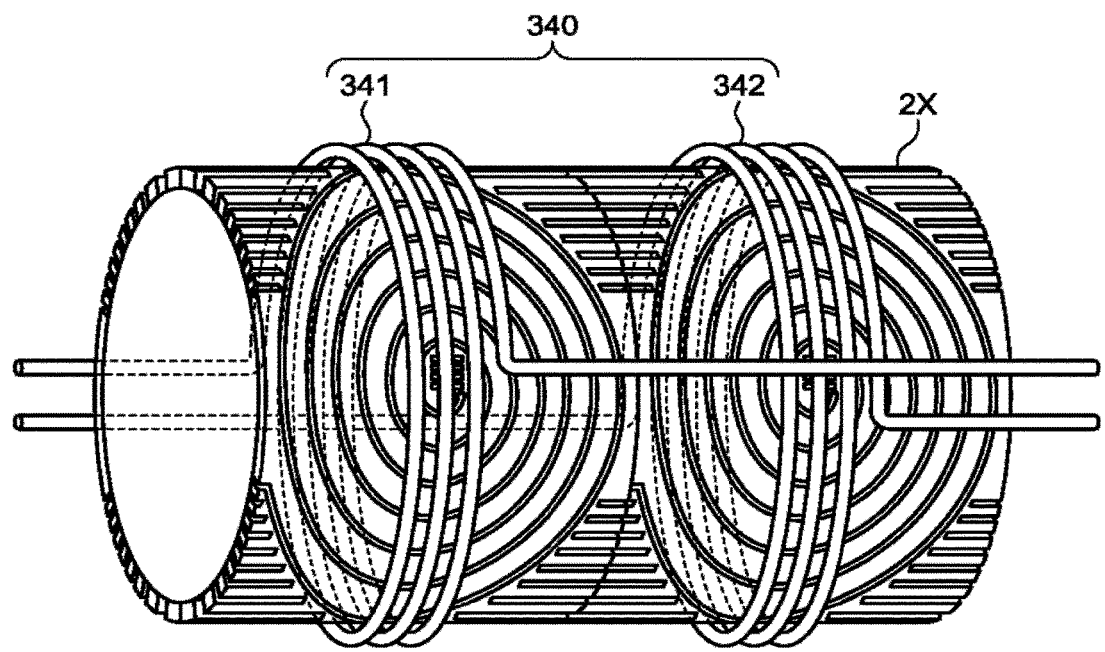
FIG. 12 is a drawing illustrating an example of a local cooling pipe according to a fourth embodiment.

FIG. 12 is a drawing illustrating an example of a local cooling pipe according to the fourth embodiment. For the sake of convenience in the explanation, FIG. 12 illustrates only the X-coil 2X from among the three coils included in the gradient coil 2.

For example, as illustrated in FIG. 12, a local cooling pipe 340 according to the fourth embodiment includes a first local cooling pipe 341 and a second local cooling pipe 342.

The first local cooling pipe 341 has an inlet for the refrigerant on the side of one end in terms of the axial direction of the gradient coil 2 (i.e., the left side in FIG. 12) and has an outlet for the refrigerant on the side of the other end (i.e., the right side in FIG. 12). In this situation, the first local cooling pipe 341 is linearly arranged in the portions positioned between the one end in terms of the axial direction of the gradient coil 2 and the center of each of such coil loops included in the X-coil 2X that are positioned on the side of the one end in terms of the axial direction of the gradient coil 2. In contrast, in the vicinity of the centers of such coil loops, the first local cooling pipe 341 is helically arranged to be wound around the X-coil 2X in the circumferential direction. In other words, the first local cooling pipe 341 is arranged densely in such sections that have a large number of interlinks of the magnetic flux, on the side of the one end in terms of the axial direction of the gradient coil 2.

The second local cooling pipe 342 has an inlet for the refrigerant on the side of the one end in terms of the axial direction of the gradient coil 2 (i.e., the left side in FIG. 12) and has an outlet for the refrigerant on the side of the other end (i.e., the right side in FIG. 12). In this situation, the second local cooling pipe 342 is linearly arranged in the portions positioned between the one end in terms of the axial direction of the gradient coil 2 and the center of each of such coil loops included in the X-coil 2X that e positioned on the side f the other end in terms of the axial direction of the gradient coil 2. In contrast, in the vicinity of the centers of such coil loops, the second local cooling pipe 342 is helically arranged to be wound around the X-coil 2X in the circumferential direction. In other words, the second local cooling pipe 342 is arranged densely in such sections that have a large number of interlinks of the magnetic flux, on the side of the other end in terms of the axial direction of the gradient coil 2.

Alternatively, for each of the first local cooling pipe 341 and the second local cooling pipe 342, the inlet and the outlet for the refrigerant may be interchanged with each other.

As explained above, similarly to the local cooling pipes described in the above embodiments, the local cooling pipe 340 according to the fourth embodiment is arranged densely in such sections of the gradient coil 2 that have the large number of interlinks of the magnetic flux. Accordingly, in the fourth embodiment also, it is possible to cool the gradient coil 2 while prioritizing such sections in the gradient coil 2 that generate more heat than other sections.

Fifth Embodiment

In the embodiments above, the examples are explained in which the switcher 80 switches the flow volume ratio between the refrigerant supplied to the main cooling pipe 30 and to the local cooling pipe 40 or the flow volume ratio among the flows of refrigerant supplied to the plurality of local cooling pipes; however, possible embodiments are not limited to these examples. For instance, when the gradient coil 2 is provided with a plurality of main cooling pipes, the switcher 80 may be configured to switch the flow volume ratio between the flows of refrigerant supplied to the plurality of main cooling pipes.

Figure 13:
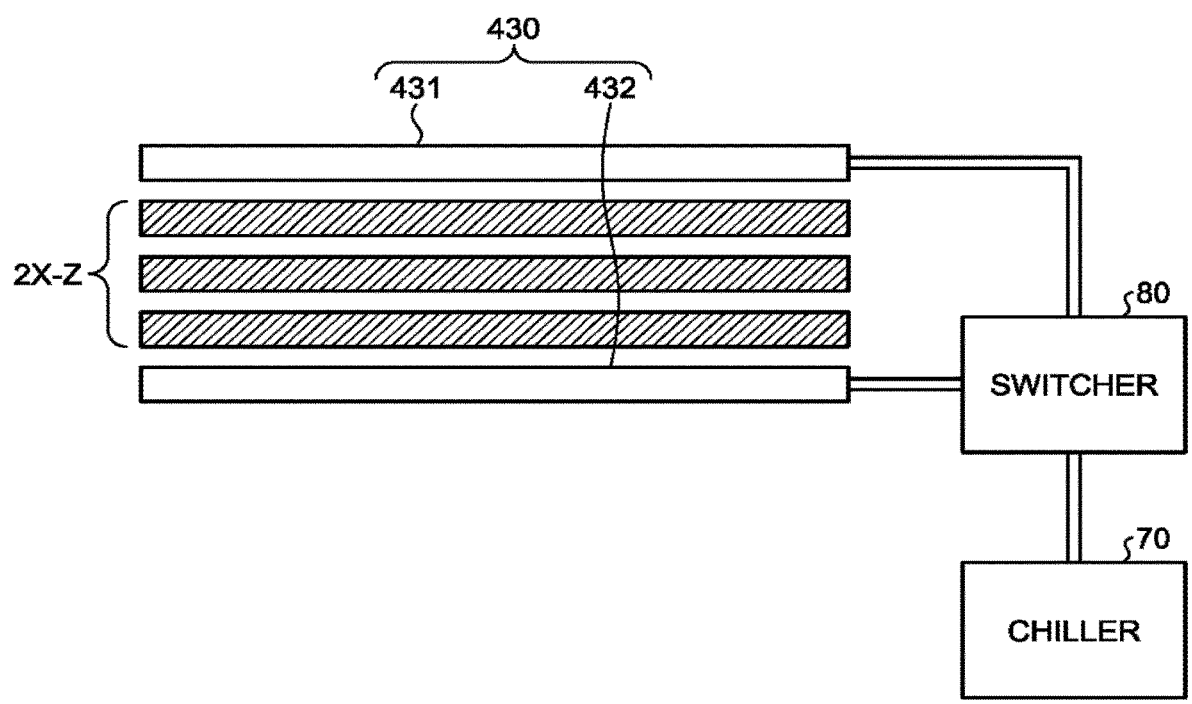
FIG. 13 is a drawing illustrating an example of main cooling pipes according to a fifth embodiment.

FIG. 13 is a drawing illustrating an example of the main cooling pipes according to a fifth embodiment. For example, as illustrated in FIG. 13, in the fifth embodiment, the MRI apparatus 100 includes, as a main cooling pipe 430, a first main cooling pipe 431 and a second main cooling pipe 432.

The first main cooling pipe 431 is arranged on the outer circumferential side of the three coils (the X-coil, the Y-coil, and the Z-coil) 2X, 2Y, and 2Z included in the gradient coil 2. Further, the second main cooling pipe 432 is arranged on the inner circumferential side of the three coils 2X, 2Y, and 2Z included in the gradient coil 2.

In this situation, in the fifth embodiment, the main temperature sensor 50 is configured to measure, separately from each other, the temperature of the coil arranged in the outermost position among the three coils included in the gradient coil 2 and the temperature of the coil arranged in the innermost position among the three coils.

Further, in the fifth embodiment, when the temperature of the coil arranged in the outermost position becomes higher than the temperature of the coil arranged in the innermost position during the imaging process, the imaging condition controlling function 16a and the signal processing function 16b are configured to increase the flow volume ratio of the refrigerant supplied to the first main cooling pipe 431 by the switcher 80, in such a manner that the volume of the refrigerant flowing through the first main cooling pipe 431 is larger than the volume of the refrigerant flowing through the second main cooling pipe 432. On the contrary, when the temperature of the coil arranged in the innermost position becomes higher than the temperature of the coil arranged in the outermost position during the imaging process, the imaging condition controlling function 16a and the signal processing function 16b are configured to increase the flow volume ratio of the refrigerant supplied to the second main cooling pipe 432 by the switcher 80, in such a manner that the volume of the refrigerant flowing through the second main cooling pipe 432 is larger than the volume of the refrigerant flowing through the first main cooling pipe 431.

As explained above, according to the fifth embodiment, it is possible to cool the gradient coil 2 while prioritizing such a region in the gradient coil 2 where the temperature rises drastically, by switching the flow volume ratio between the flows of the refrigerant supplied to the plurality of main cooling pipes, in accordance with the heat generation amounts of the coils included in the gradient coil 2. With this arrangement, it is possible to further enhance the cooling efficiency for the gradient coil 2.

In the embodiments described above, the example is explained in which the coils included in the gradient coil 2 and the cooling pipes are structured as separate members; however, possible embodiments are not limited to this example. For example, it is also acceptable to integrally form the coils included in the gradient coil with the cooling pipes. More specifically, the coils included in the gradient coil are each formed to have a hollow and circular cylindrical shape so as to have the refrigerant circulated on the inside of the cylinder. In that situation, for example, the Z-coil functions as a main cooling pipe, whereas the X-coil and the Y-coil function as local cooling pipes.

Further, in the embodiments described above, the example of the MRI apparatus 100 of a so-called tunnel type was explained in which the static magnetic field magnet 1 and the gradient coil 2 are each formed to have a substantially circular cylindrical shape; however, possible embodiments are not limited to this example. For instance, it is possible to similarly apply any of the configurations used for cooling the gradient coil 2 explained in the above embodiments to an MRI apparatus of a so-called open type in which a pair of static magnetic field magnets and a pair of gradient coils are arranged to oppose each other, while the imaging space in which the subject S is placed is interposed therebetween.

Further, the embodiments described above do not necessarily have to be carried out individually and may be carried out in combination as appropriate.

Further, the gradient coil 2 described in the above embodiments may be structured as a gradient coil unit. In that situation, for example, the gradient coil unit is formed by laminating together an X-coil, a Y-coil, and a Z-coil, while cooling layers used for cooling the coils are provided between the layers of the coils. In this configuration, each of the X-, Y-, and Z-coils will be referred to as a gradient coil. Further, the cooling layers are structured to have a first cooling pipe configured to cool the gradient coils entirely and a second cooling pipe configured to locally cool one or more of the gradient coils.

The term "processor" used in the explanations of the above embodiments denotes, for example, a Central Processing Unit (CPU), a Graphics Processing Unit (GPU), or a circuit such as an Application Specific Integrated Circuit (ASIC) or a programmable logic device (e.g., a Simple Programmable Logic Device [SPLD], a Complex Programmable Logic Device [CPLD], or a Field Programmable Gate Array [FPGA]). In this situation, instead of saving the programs in a storage, it is also acceptable to directly incorporate the programs in the circuits of the processors. In that situation, the processors realize the functions thereof by reading and executing the programs incorporated in the circuits thereof. Further, the processors in the present embodiments do not each necessarily have to be structured as a single circuit. It is also acceptable to structure one processor by combining together a plurality of independent circuits so as to realize the functions thereof.

In this situation, the programs executed by the one or more processors are provided as being incorporated, in advance, in a Read-Only Memory (ROM), a storage, or the like. Alternatively, the programs may be provided as being recorded on a computer-readable storage medium such as a Compact Disk Read-Only Memory (CD-ROM), a flexible disk (ED), a Compact Disk Recordable (CD-R), a Digital Versatile Disk (DVD), or the like, in a file in such a format that is either installable or executable for the devices. Further, the programs may be stored in a computer connected to a network such as the Internet, so as to be provided or distributed as being downloaded via the network. For example, each of the programs is structured with a module including the functions described above. In the actual hardware, as a result of a CPU reading and executing the programs from a storage medium such as a ROM, the modules are loaded into a main storage device so as to the generated in the main storage device.

According to at least one aspect of the embodiments described above, it is possible to optimize the cooled locations in accordance with the distribution of the heat generation of the gradient coil.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
a gradient coil unit including a gradient coil configured to generate a gradient magnetic field in an imaging space in which a subject is placed, the gradient coil unit including a cooling layer configured to cool the gradient coil, the cooling layer including a first cooling pipe configured to cool the gradient coil entirely and a second cooling pipe configured to locally cool the gradient coil; and
a switcher configured to change at least one of (1) a flow volume ratio and (2) flowing directions between refrigerant flowing through the first cooling pipe and refrigerant flowing through the second cooling pipe, such that a relative amount of cooling between the first cooling pipe and the second cooling pipe is changed, the switcher being controlled using measurements from respective temperature sensors.

2. The magnetic resonance imaging apparatus according to claim 1, further comprising: a controller configured to control a flow volume of refrigerant circulated through the second cooling pipe.

3. The magnetic resonance imaging apparatus according to claim 2, wherein the controller controls the flow volume of the refrigerant on a basis of a temperature of the gradient coil.

4. The magnetic resonance imaging apparatus according to claim 2, wherein the controller controls the flow volume of the refrigerant on a basis of an imaging condition.

5. The magnetic resonance imaging apparatus according to claim 1, further comprising a chiller configured to change at least one of a flow volume and a temperature of the refrigerant.

6. The magnetic resonance imaging apparatus according to claim 1, wherein the second cooling pipe is arranged densely in a section of the gradient coil in which interlinks of magnetic flux locally increase.

7. The magnetic resonance imaging apparatus according to claim 6, wherein the second cooling pipe is linearly arranged in a portion positioned between at least one end of the gradient coil and the section in which interlinks of the magnetic flux locally increase.

8. The magnetic resonance imaging apparatus according to claim 1, wherein the first cooling pipe and the second cooling pipe are arranged in a resin around the gradient coil.

9. The magnetic resonance imaging apparatus according to claim 1, wherein the first cooling pipe and the second cooling pipe are arranged in the gradient coil.

10. The magnetic resonance imaging apparatus according to claim 1, wherein the second cooling pipe extends in a direction that is the same direction as the gradient coil extends.

11. A magnetic resonance imaging apparatus comprising:
a gradient coil that is formed to have a shape of a substantially circular cylinder and is configured to generate a gradient magnetic field in a space within the circular cylinder, the gradient coil including at least one saddle coil;
a first cooling pipe and a second cooling pipe configured to circulate refrigerant used for cooling the gradient coil, the first cooling pipe being arranged substantially over an entirety of the gradient coil along the circular cylinder, the second cooling pipe being arranged densely in a vicinity of a center of a coil loop included in the saddle coil, the coil loop generating the gradient magnetic field along at least one of X-axis and Y-axis; and
a switcher configured to change at least one of (1) a flow volume ratio and (2) flowing directions between refrigerant flowing through the first cooling pipe and refrigerant flowing through the second cooling pipe, such that a relative amount of cooling between the first cooling pipe and the second cooling pipe is changed, the switcher being controlled using measurements from respective temperature sensors.

12. The magnetic resonance imaging apparatus according to claim 11, wherein the first cooling pipe and the second cooling pipe are arranged in the gradient coil.

13. The magnetic resonance imaging apparatus according to claim 11, wherein the second cooling pipe extends in a direction that is the same direction as the gradient coil extends.

14. The magnetic resonance imaging apparatus according to claim 11, wherein the first cooling pipe and the second cooling pipe are arranged in a resin around the gradient coil.

15. A magnetic resonance imaging apparatus comprising:
a gradient coil unit including a gradient coil configured to generate a gradient magnetic field in an imaging space in which a subject is placed, the gradient coil unit including a cooling layer configured to cool the gradient coil, the cooling layer including a first cooling pipe configured to cool the gradient coil entirely and a second cooling pipe configured to locally cool the gradient coil, the second cooling pipe being arranged in a vortex formation, in a vicinity of a center of a coil loop included in the gradient coil; and
a switcher configured to change a relative amount of cooling between the first cooling pipe and the second cooling pipe, the switcher being controlled using measurements from respective temperature sensors.

16. The magnetic resonance imaging apparatus according to claim 15, wherein the switcher configured to change the relative amount of cooling between the first cooling pipe and the second cooling pipe comprises a switcher configured to change at least one of (1) a flow volume ratio and (2) flowing directions between refrigerant flowing through the first cooling pipe and refrigerant flowing through the second cooling pipe, such that a relative amount of cooling between the first cooling pipe and the second cooling pipe is changed.

17. A magnetic resonance imaging apparatus comprising:
a gradient coil that is formed to have a shape of a substantially circular cylinder and is configured to generate a gradient magnetic field in a space within the circular cylinder, the gradient coil including at least one saddle coil;
a first cooling pipe and a second cooling pipe configured to circulate refrigerant used for cooling the gradient coil, the first cooling pipe being arranged substantially over an entirety of the gradient coil along the circular cylinder, the second cooling pipe being arranged in a vortex formation, in a vicinity of a center of a coil loop included in the saddle coil of the gradient coil, the coil loop generating the gradient magnetic field along at least one of X-axis and Y-axis; and
a switcher configured to change a relative amount of cooling between the first cooling pipe and the second cooling pipe, the switcher being controlled using measurements from respective temperature sensors.

18. The magnetic resonance imaging apparatus according to claim 17, wherein the switcher configured to change the relative amount of cooling between the first cooling pipe and the second cooling pipe comprises a switcher configured to change at least one of (1) a flow volume ratio and (2) flowing directions between refrigerant flowing through the first cooling pipe and refrigerant flowing through the second cooling pipe, such that a relative amount of cooling between the first cooling pipe and the second cooling pipe is changed.

* * * * *